(12) United States Patent
Shoeb et al.

(10) Patent No.: US 12,712,159 B2
(45) Date of Patent: Aug. 18, 2026

(54) SYSTEMS FOR CONTROLLING PLASMA DENSITY DISTRIBUTION PROFILES INCLUDING MULTI-RF ZONED SUBSTRATE SUPPORTS

(71) Applicant: LAM RESEARCH CORPORATION, Fremont, CA (US)

(72) Inventors: Juline Shoeb, Fremont, CA (US); Alexander Miller Paterson, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 904 days.

(21) Appl. No.: 18/013,145

(22) PCT Filed: Oct. 12, 2021

(86) PCT No.: PCT/US2021/054514

§ 371 (c)(1),
(2) Date: Dec. 27, 2022

(87) PCT Pub. No.: WO2022/081535

PCT Pub. Date: Apr. 21, 2022

(65) Prior Publication Data

US 2023/0352272 A1 Nov. 2, 2023

Related U.S. Application Data

(60) Provisional application No. 63/092,948, filed on Oct. 16, 2020.

(51) Int. Cl.
*H01J 37/32* (2006.01)
*H10P 72/72* (2026.01)

(52) U.S. Cl.
CPC .. *H01J 37/32568* (2013.01); *H01J 37/32091* (2013.01); *H01J 37/32715* (2013.01); *H10P 72/722* (2026.01)

(58) Field of Classification Search
CPC ............... H01J 37/32091; H01J 37/321; H01J 37/32165; H01J 37/32568;
(Continued)

(56) References Cited

U.S. PATENT DOCUMENTS 9,105,449 B2 8/2015 Benjamin
9,812,293 B2 11/2017 Um et al.
(Continued)

FOREIGN PATENT DOCUMENTS

JP S6324623 A * 2/1988
KR 1020170035650 A 3/2017
WO WO-2020142239 A1 7/2020

OTHER PUBLICATIONS

Office Action issued in corresponding Taiwanese Application No. 110138262 dated Nov. 12, 2025.
(Continued)

*Primary Examiner* — Benjamin Kendall

(57) ABSTRACT

A substrate processing system includes a substrate support, N RF sources and a controller. The substrate support is arranged in a processing chamber, supports a substrate on an upper surface thereof, and includes: a baseplate made of electrically conductive material and M electrodes disposed in the baseplate. Each of the N RF sources supplies a respective RF signal to one or more of the M electrodes, where: M and N are integers greater than or equal to two; each of the respective RF signals is supplied to a different set of the M electrodes; and each of the sets includes a different one or more of the M electrodes. The controller causes one or more coils to strike and maintain plasma in the processing chamber independently of the N RF sources and separately controls voltage outputs of the N RF sources to adjust the plasma in the processing chamber.

67 Claims, 20 Drawing Sheets

(58) Field of Classification Search
CPC .......... H01J 37/32706; H01J 37/32715; H10P 72/722; H01L 21/6833
See application file for complete search history.

(56) References Cited

U.S. PATENT DOCUMENTS

| | | | | |
|---|---|---|---|---|
| 9,966,236 | B2 | 5/2018 | Long et al. | |
| 2002/0159216 | A1* | 10/2002 | Ennis ................ | H01J 37/32935 361/234 |
| 2006/0048894 | A1* | 3/2006 | Yamazaki ............ | H10D 86/021 257/E21.414 |
| 2011/0031217 | A1* | 2/2011 | Himori ............. | H01J 37/32091 156/345.48 |
| 2017/0110358 | A1 | 4/2017 | Sadjadi et al. | |
| 2017/0169996 | A1* | 6/2017 | Ui ..................... | H01J 37/32422 |
| 2019/0013184 | A1 | 1/2019 | Cui et al. | |
| 2019/0148119 | A1* | 5/2019 | Sung ................. | H01J 37/32724 156/345.48 |
| 2020/0043703 | A1 | 2/2020 | French et al. | |
| 2021/0296083 | A1 | 9/2021 | Kaneko et al. | |

OTHER PUBLICATIONS

International Search Report and Written Opinion of the ISA issued in PCT/US2021/054514, mailed Feb. 4, 2022; ISA/KR.
Office Action issued in corresponding Japanese App No. 2023522961 mailed Jul. 22, 2025.

* cited by examiner 200
202

271
272
204
274
206
254
238
242
244
240
252
282
246
Ro
Ri
260
290
Re
234
268
236
270
232
266
264
280
Dielectric Window
Pinnacle
250
TCCT Match Network
248
$V_{AC}$
205
239
262
230
207
212
220
210
Third Matching Network
216
Third RF Generator
208
Second Matching Network
214
Second RF Generator
First Matching Network
First RF Generator
255
Power Source
Controller

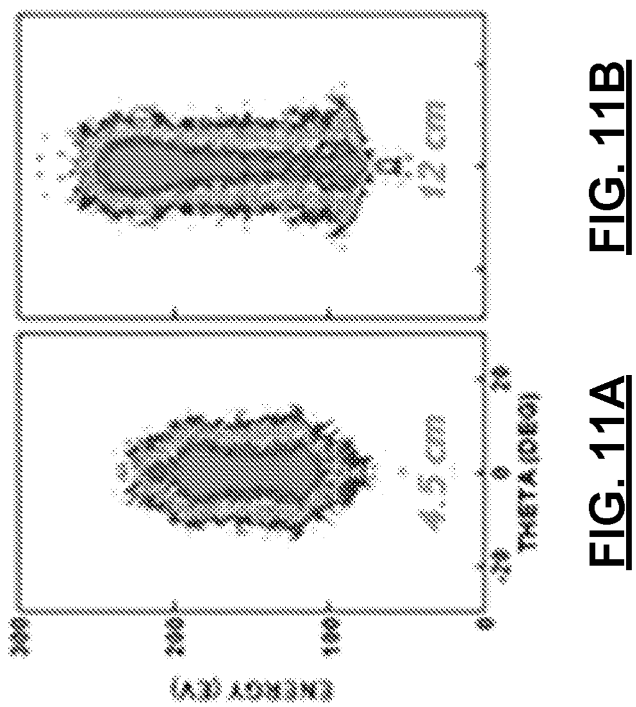
FIG. 11A
FIG. 11B
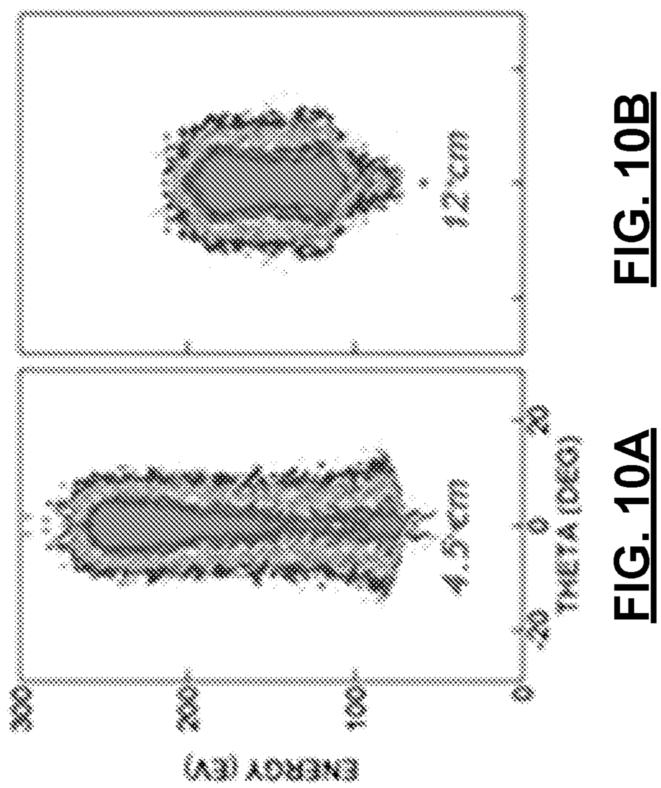
FIG. 10A
FIG. 10B

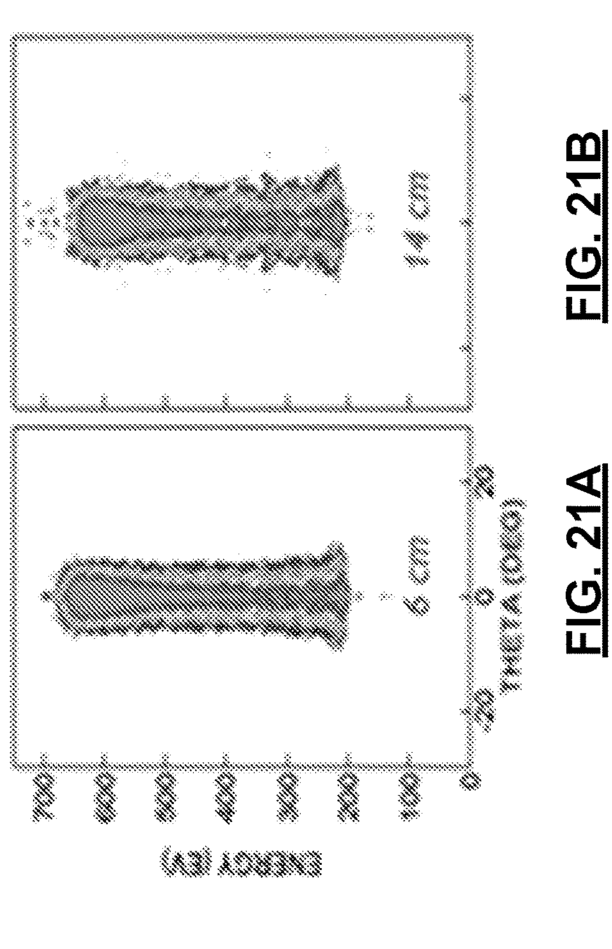
FIG. 21A
FIG. 21B
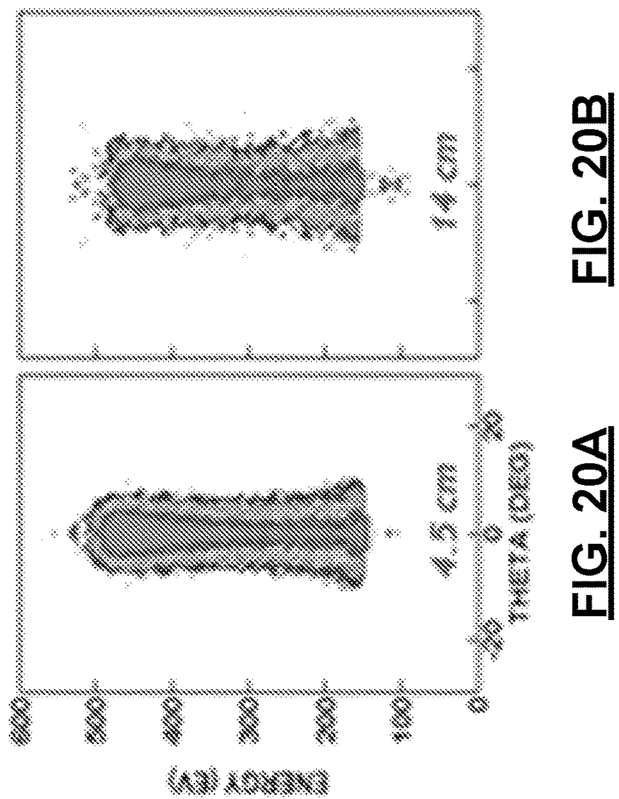
FIG. 20A
FIG. 20B

SYSTEMS FOR CONTROLLING PLASMA DENSITY DISTRIBUTION PROFILES INCLUDING MULTI-RF ZONED SUBSTRATE SUPPORTS

CROSS-REFERENCE TO RELATED APPLICATIONS

This application is a U.S. National Phase Application under 35 U.S.C. 371 of International Application No. PCT/US2021/054514, filed on Oct. 12, 2021, which claims the benefit of U.S. Provisional Application No. 63/092,948, filed on Oct. 16, 2020. The entire disclosures of the above applications are incorporated herein by reference.

FIELD

The present disclosure relates to systems for controlling a plasma density distribution profile in a processing chamber.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

During manufacturing of semiconductor devices, etch and deposition processes are performed within a processing chamber. Ionized gas, or plasma, is introduced into the processing chamber to etch (or remove) material from a substrate such as a semiconductor wafer, and to sputter or deposit material onto the substrate. The substrate is disposed in the processing chamber on a substrate support such as an electrostatic chuck or a pedestal. Creating plasma for use in manufacturing or fabrication processes typically begins by introducing process gases into the processing chamber. Gas molecules within the processing chamber are then excited to generate plasma.

The processing chamber may include transformer coupled plasma (TCP) reactor coils. A radio frequency (RF) signal, generated by a power source, is supplied to the TCP reactor coils. The TCP reactor coils are driven by a transformer coupled capacitive tuning (TCCT) match network. The TCCT match network receives the RF signal supplied by the power source and enables tuning of power provided to the TCP reactor coils. A dielectric window, constructed of a material such as ceramic, is incorporated into an upper surface of the processing chamber. The dielectric window allows the RF signal to be transmitted from the TCP reactor coils into the interior of the processing chamber. The RF signal excites the gas molecules in the processing chamber to generate the plasma.

SUMMARY

A substrate processing system is provided and includes a substrate support, N RF sources and a controller. The substrate support is arranged in a processing chamber, configured to support a substrate on an upper surface thereof, and includes: a baseplate made of electrically conductive material and M electrodes disposed in the baseplate, where M is an integer greater than or equal to two. Each of the N RF sources is configured to supply a respective RF signal to one or more of the M electrodes, where: N is an integer greater than or equal to two; each of the respective RF signals is supplied to a different set of the M electrodes; and each of the sets includes a different one or more of the M electrodes. The controller is configured to cause one or more coils to strike and maintain plasma in the processing chamber independently of the N RF sources and to separately control voltage outputs of the N RF sources to adjust the plasma in the processing chamber.

In other features, M is greater than or equal to N. In other features, N is greater than or equal to M.

In other features, the controller is configured to at least one of: select which one or more of the N RF sources is to provide one or more of the respective RF signals to one of the M electrodes; or for each set of the M electrodes, select which one or more of the N RF sources is to provide one or more of the respective RF signals to that set of the M electrodes. In other features, M is greater than or equal to N.

In other features, the substrate processing system further includes N cavities located on an upper surface of the baseplate, wherein the M electrodes are arranged in the N cavities. In other features, the M electrodes are embedded in dielectric material located in the N cavities.

In other features, the substrate processing system further includes N cavities located on an upper surface of the baseplate, where the M electrodes are arranged in the N cavities. In other features, the M electrodes are embedded in dielectric material located in the N cavities.

In other features, the substrate processing system further includes: N cavities located on an upper surface of the baseplate, where the M electrodes are arranged in the N cavities; and M dielectric separators arranged between the M electrodes and the substrate, where M is an integer greater than or equal to one.

In other features, the substrate processing system further includes a dielectric layer arranged between the M electrodes and the baseplate. In other features, a frequency of the N RF signals is the same as a frequency used to generate the plasma. In other features, a frequency of the N RF signals is different than a frequency used to generate the plasma.

In other features, the substrate processing system further includes: the processing chamber, where the one or more coils includes an inner coil and an outer coil, the inner coil is arranged outside of the processing chamber and adjacent to a window of the processing chamber, and the outer coil is arranged outside of the processing chamber adjacent to the window and radially outside of and spaced from the inner coil; and an RF source configured to power the inner coil and the outer coil. The controller is further configured to control the RF source to adjust current supplied to the inner coil relative to current supplied to the outer coil.

In other features, the controller is configured to control the RF source to one of: supply more current to the outer coil than to the inner coil; or supply more current to the inner coil than to the outer coil. In other features, the substrate processing system further includes an RF source configured to supply a bias voltage to the baseplate.

In other features, at least one of the N RF signals has a frequency that is different than at least another one of the N RF signals. In other features, the N RF signals have the same frequency. In other features, the substrate processing system further includes N matching networks arranged between the N RF sources and the M electrodes.

In other features, a substrate processing system is provided and includes a substrate support, N radio frequency (RF) sources, and a controller. The substrate support is arranged in a processing chamber, configured to support a substrate on an upper surface thereof, and includes: a baseplate made of conductive material; and N electrodes disposed in the baseplate, where N is an integer greater than or equal to two. The N RF sources are configured to supply N RF signals to the N electrodes, respectively. The controller is configured to strike and maintain plasma in the processing chamber independently of the N RF sources and to separately control voltage outputs of the N RF sources to adjust the plasma in the processing chamber.

In other features, a substrate processing system is provided and includes a processing chamber, a substrate support, an inner coil, an outer coil, N RF sources, N matching networks and a controller. The processing chamber includes a window. The substrate support is arranged in the processing chamber, is configured to support a substrate on an upper surface thereof and includes a baseplate, and M electrodes disposed in the baseplate, where M is an integer greater than or equal to 2. The inner coil is arranged outside of the processing chamber adjacent to the window. The outer coil is arranged outside of the processing chamber adjacent to the window and radially outside of and spaced from the inner coil. Each of the N RF sources is configured to supply a respective RF signal to one or more of the M electrodes, where: N is an integer greater than or equal to two; each of the respective RF signals is supplied to a different set of the M electrodes; and each of the sets includes a different one or more of the M electrodes. The N matching networks are arranged between the N RF sources and the M electrodes. The controller is configured to strike plasma by supplying RF power to the inner and outer coils and to vary a plasma density distribution profile in the processing chamber by (i) varying power supplied to the inner coil relative to the outer coil, and (ii) varying power supplied to at least one of the M electrodes relative to at least another one of the M electrodes.

In other features, M is greater than or equal to N. In other features, N is greater than or equal to M.

In other features, the controller is configured to at least one of: select which one or more of the N RF sources is to provide one or more of the respective RF signals to one of the M electrodes; or for each set of the M electrodes, select which one or more of the N RF sources is to provide one or more of the respective RF signals to that set of the M electrodes. In other features, M is greater than or equal to N.

In other features, the substrate processing system further includes N cavities located on an upper surface of the baseplate, wherein the M electrodes are arranged in the N cavities. In other features, the M electrodes are embedded in dielectric material located in the N cavities.

In other features, the substrate processing system further includes N cavities located on an upper surface of the baseplate, wherein the M electrodes are arranged in the N cavities. In other features, the M electrodes are embedded in dielectric material located in the N cavities.

In other features, the substrate processing system further includes: N cavities located on an upper surface of the baseplate, wherein the M electrodes are arranged in the N cavities; and M dielectric separators arranged between the M electrodes and the substrate, where M is an integer greater than or equal to one.

In other features, the substrate processing system further includes a dielectric layer arranged between the M electrodes and the baseplate. In other features, a frequency of the N RF signals is the same as a frequency used to generate the plasma.

In other features, a frequency of the N RF signals is different than a frequency used to generate the plasma. In other features, the substrate processing system further includes a matching network connected between an RF source and the inner coil and the outer coil.

In other features, the controller is configured to control the RF source to supply more current to the outer coil than to the inner coil. In other features, the substrate processing system further includes an RF source configured to supply a bias voltage to the baseplate.

In other features, at least one of the N RF signals has a frequency that is different than at least another one of the N RF signals. In other features, the N RF signals have the same frequency.

In other features, the M electrodes comprise a first electrode and a second electrode. The controller is configured to control the supply of the RF signals such that: a first amount of power is supplied to the inner coil and a second amount of power is supplied to the outer coil, where the first amount of power is different than the second amount of power, and a first RF voltage is supplied to the first electrode and a second RF voltage is supplied to the second electrode, where the first RF voltage is greater than the second RF voltage.

In other features, the first electrode is disposed in the baseplate more radially inward than the second electrode and receives a higher RF voltage than the second electrode. In other features, the first electrode is disposed more radially outward in the baseplate than the second electrode and receives a higher RF voltage than the second electrode.

In other features, the M electrodes comprise a first set of electrodes and a second set of electrodes. The first set of electrodes correspond to a first RF zone. The second set of electrodes correspond to a second RF zone. The second RF zone is located radially inwardly from the first RF zone.

In other features, the M electrodes are disposed in a plane parallel to and offset from the upper surface of the substrate support. In other features, the M electrodes are disposed in different layers of the baseplate.

In other features, the controller is configured to control the N RF signals to adjust the plasma to increase plasma uniformity during a transient period during startup of the N RF sources. In other features, one or more of the M electrodes also operates as a heating element.

In other features, a substrate processing system is provided and includes: a processing chamber, a substrate support, an inner coil, an outer coil, N RF sources, N matching networks, and a controller. The processing chamber includes a window. The substrate support is arranged in the processing chamber, configured to support a substrate on an upper surface thereof and includes: a baseplate; and N electrodes disposed in the baseplate, where N is an integer greater than or equal to 2. The inner coil arranged outside of the processing chamber adjacent to the window. The outer coil is arranged outside of the processing chamber adjacent to the window and radially outside of and spaced from the inner coil. The N RF sources are configured to supply N RF signals. The N matching networks are arranged between the N RF sources and the N electrodes. The controller is configured to strike plasma by supplying RF power to the inner and outer coils and to vary a plasma density distribution profile in the processing chamber by (i) varying power supplied to the inner coil relative to the outer coil, and (ii) varying power supplied to at least one of the N electrodes relative to at least another one of the N electrodes.

In other features, a substrate processing system is provided and includes a processing chamber, a substrate support, an inner coil, an outer coil, N RF sources, N matching networks, and a controller. The processing chamber includes a window. The substrate support is arranged in the processing chamber, configured to support a substrate on an upper surface thereof and includes: a baseplate; and a dielectric layer arranged above the baseplate and including M electrodes disposed in the dielectric layer, where M is an integer greater than or equal to two. The inner coil is arranged outside of the processing chamber adjacent to the window. The outer coil is arranged outside of the processing chamber adjacent to the window and radially outside of and spaced from the inner coil. Each of the N RF sources is configured to supply a respective RF signal to one or more of the M electrodes, where: N is an integer greater than or equal to two; each of the respective RF signals is supplied to a different set of the M electrodes; and each of the sets includes a different one or more of the M electrodes. The N matching networks are arranged between the N RF sources and the M electrodes. The controller is configured to strike plasma by supplying RF power to the inner and outer coils and to vary a plasma density distribution profile in the processing chamber by (i) varying power supplied to the inner coil relative to the outer coil, and (ii) varying power supplied to at least one of the M electrodes relative to power supplied to at least another one the M electrodes.

In other features, M is greater than or equal to N. In other features, N is greater than or equal to M.

In other features, the controller is configured to at least one of: select which one or more of the N RF sources is to provide one or more of the respective RF signals to one of the M electrodes; or for each set of the M electrodes, select which one or more of the N RF sources is to provide one or more of the respective RF signals to that set of the M electrodes. In other features, M is greater than or equal to N.

In other features, the substrate processing system further includes N cavities located on an upper surface of the baseplate, wherein the M electrodes are arranged in the N cavities. In other features, the M electrodes are embedded in dielectric material located in the N cavities.

In other features, a frequency of the N RF signals is the same as a frequency used to generate the plasma. In other features, a frequency of the N RF signals different than a frequency used to generate the plasma.

In other features, the substrate processing system further includes a matching network connected between an RF source and the inner coil and the outer coil. In other features, the controller is configured to control the RF source to supply more current to the outer coil than to the inner coil. In other features, the substrate processing system further includes an RF source configured to supply a bias voltage to the baseplate.

In other features, at least one of the N RF signals has a frequency that is different than at least another one of the N RF signals. In other features, the N RF signals have the same frequency.

In other features, the M electrodes comprise a first electrode and a second electrode. The controller is configured to control the supply of the RF signals such that: a first amount of power is supplied to the inner coil and a second amount of power is supplied to the outer coil, wherein the first amount of power is different than the second amount of power; and a first RF voltage is supplied to the first electrode and a second RF voltage is supplied to the second electrode, wherein the first RF voltage is greater than the second RF voltage.

In other features, the first electrode is disposed in the baseplate more radially inward than the second electrode and receives a higher RF voltage than the second electrode. In other features, the first electrode is disposed more radially outward in the baseplate than the second electrode and receives a higher RF voltage than the second electrode.

In other features, the M electrodes include a first set of electrodes and a second set of electrodes. The first set of electrodes correspond to a first RF zone. The second set of electrodes correspond to a second RF zone. The second RF zone is located radially inwardly from the first RF zone.

In other features, the M electrodes are disposed in the dielectric layer a plane parallel to and below the upper surface of the substrate support. In other features, the M electrodes are disposed in different layers of the baseplate.

In other features, the controller is configured to control the N RF signals to adjust the plasma to increase plasma uniformity during a transient period during startup of the N RF sources. In other features, one or more of the M electrodes also operates as a heating element.

In other features, a substrate processing system is provided and includes a processing chamber, a substrate support, an inner coil, an outer coil, N RF sources, N matching networks, and a controller. The processing chamber includes a window. The substrate support is arranged in the processing chamber, configured to support a substrate on an upper surface thereof and includes: a baseplate; and a dielectric layer arranged above the baseplate and including N electrodes disposed in the dielectric layer, where N is an integer greater than or equal to 2. The inner coil is arranged outside of the processing chamber adjacent to the window. The outer coil is arranged outside of the processing chamber adjacent to the window and radially outside of and spaced from the inner coil. The N radio frequency (RF) sources are configured to supply N RF signals. The N matching networks are arranged between the N RF sources and the N electrodes. The controller is configured to strike plasma by supplying RF power to the inner and outer coils and to vary a plasma density distribution profile in the processing chamber by (i) varying power supplied to the inner coil relative to the outer coil, and (ii) varying power supplied to at least one of the N electrodes relative to power supplied to at least another one the N electrodes.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 10A and 10B are example plots of energy versus angle of spread of ions for two RF zones where the radially inner zone receives a higher RF voltage than the radially outer zone in accordance with the present disclosure;

FIGS. 11A and 11B are example plots of energy versus angle of spread of ions for two RF zones where the radially outer zone receives a higher RF voltage than the radially inner zone in accordance with the present disclosure;

FIGS. 20A and 20B are example plots of energy versus angle of spread of ions for two RF zones provided by the substrate support of FIG. 14 in accordance with the present disclosure;

FIGS. 21A and 21B are example plots of energy versus angle of spread of ions for two RF zones provided by the substrate support of FIG. 17 in accordance with the present disclosure;

In the drawings, reference numbers may be reused to identify similar and/or identical elements.

DETAILED DESCRIPTION

Figure 1:
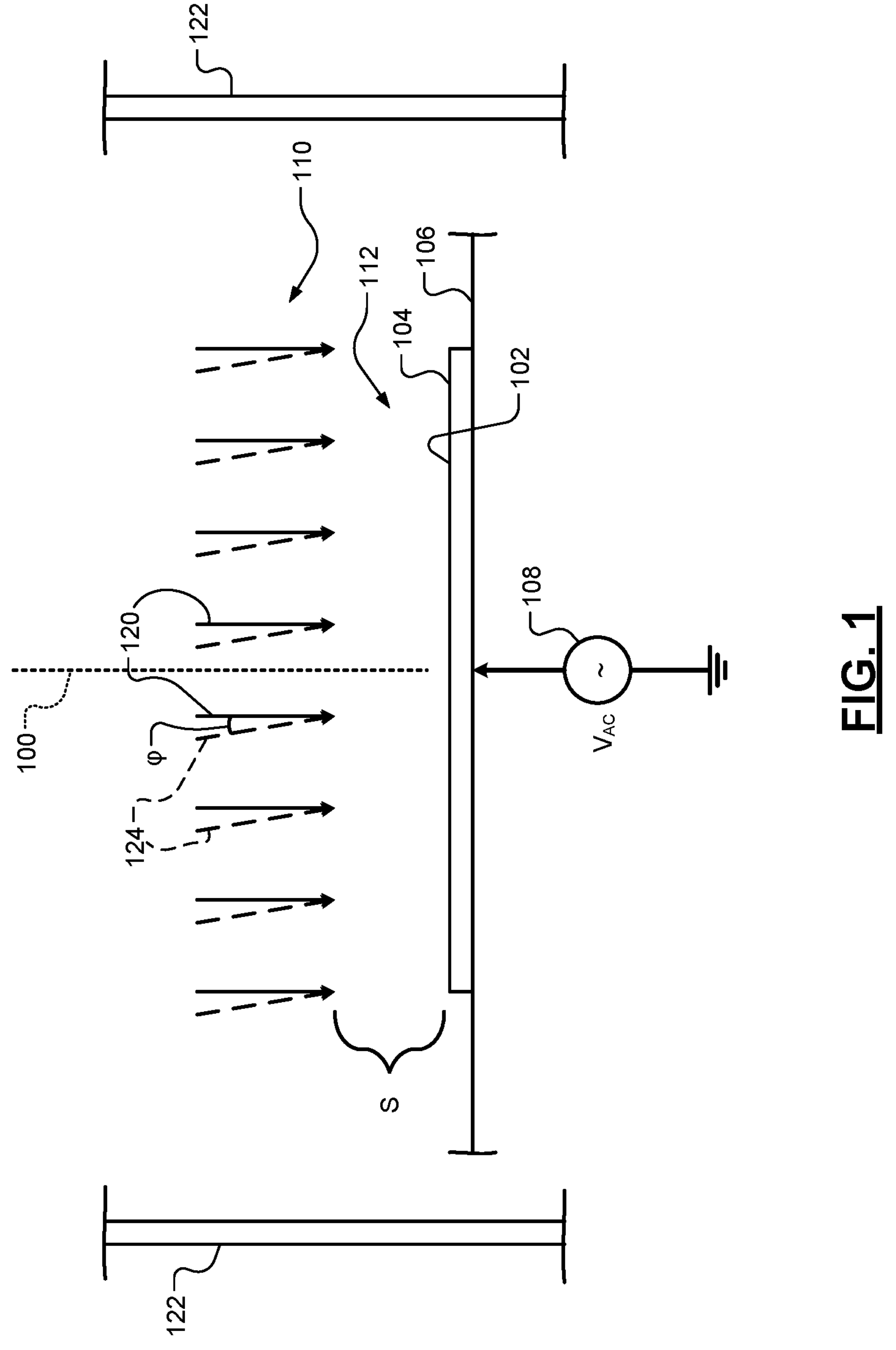
FIG. 1 is a diagram illustrating an ion incident angle relative to a plasma sheath above a surface of a substrate.

FIG. 1 shows an ion incident angle φ relative to a plane 100 extending perpendicular to a top surface 102 of a substrate 104. The substrate 104 is disposed on a substrate support 106 and may receive a bias voltage represented by a voltage source 108. Plasma 110 is generated above the substrate 104. An electron depleted area 112 exists between the plasma 110 and the substrate 104 and is referred to as a plasma sheath. The plasma sheath has a thickness s. Plasma density is proportional to an inverse of the square root of thickness s.

For vertical and untitled or directional etching of the substrate, ion flow should be in a direction parallel to the plane 100 and/or in a direction, which is perpendicular to the top surface 102, as shown by arrows 120. However, due to plasma non-uniformity that results in sheath non-uniformity and since ions strike perpendicular to sheath, such non-uniform sheath or density can result in ion tilt angle as high as a couple of degrees. This is shown by arrows 124 and can result in tilted etching of features (e.g., holes, trenches, etc.) at the acute angle rather than at 90° relative to the surface 102. Stringent requirements can include operating with an ion incidence or tilt angle (or tilt angle) of less than 0.02°.

The tilt angle of ions (which is a result of plasma density and sheath non-uniformity) is directly related to etch rate non-uniformity. An ion non-uniformity percentage may be estimated as a maximum ion flux minus a minimum ion flux divided by the maximum ion flux, as represented by equation 1, where $\text{ion}_{nonuni}$ is the ion non-uniformity. The ion non-uniformity is proportional to the etch rate non-uniformity $ER_{nonuni}$.

$$\text{ion}_{nonuni} = \frac{(\text{Max ion Flux} - \text{Min Ion Flux})}{\text{Max Ion Flux}} \propto ER_{nonuni} \quad (1)$$

Various parameters may be adjusted in an effort to improve plasma uniformity and minimize ion tilt angle. As an example, a transformer coupled plasma (TCP) system may include inner and outer reactor coils disposed above a TCP window. The size of the reactor coils, locations of the reactor coils, and the amount of current passing through the reactor coils can be adjusted to improve etch rate and plasma uniformity. The size of a chamber in which the inner and outer reactor coils are located may be increased to allow for implementation of larger reactor coils and/or increased distances between the reactor coils. Another parameter that may be adjusted is a ratio of an amount of current supplied to the inner reactor coil divided by an amount of current supplied to the outer reactor coil. Adjustment of the above-stated parameters provides a limited amount of improvement in etch rate uniformity. For example, adjusting these parameters may improve plasma non-uniformity to be as low as 5-10%, which may not satisfy the requirement of producing a highly uniform plasma that can provide a tilt angle below 0.02 degrees.

With the size requirements of features of a substrate decreasing and resolution and aspect ratio requirements increasing, it is becoming more and more difficult to meet these requirements with existing processing systems. Some feature size requirements can be as small as 10 nanometers.

The examples set forth herein include plasma density profile control systems with substrate supports (e.g., electrostatic chucks) having multiple RF electrodes. RF power to the RF electrodes is controlled to provide multiple RF zones for improved etch rate uniformity across a substrate. The substrate supports include RF electrodes that are used to provide respective RF zones. The RF electrodes are disposed in different arrangements having corresponding patterns. In some embodiments, the RF electrodes are in a same plane and/or layer of a substrate support. In other embodiments, the RF electrodes are in different planes and/or layers and may horizontally overlap. Some embodiments include one or more dielectric layers and/or dielectric separators that separate the RF electrodes from substrates. The dielectric separators may be disposed in patterns similar to the patterns of the corresponding RF electrodes.

The disclosed RF electrodes, dielectric layers, and dielectric separators are implemented to improve and minimize ion angle tilt and plasma non-uniformity. This includes controlling RF voltages provided to the RF electrodes. The improved plasma uniformity may be provided during and/or subsequent to initial transient periods when processing is initiated and RF voltages across a substrate are not at steady-state. As an example, an initial transient period may last 200-900 milliseconds (ms) after initially supplying the RF voltages to the RF electrodes. In some embodiments, voltages of the RF electrodes are set to decrease the ion tilt angle, whereas in other embodiments, the voltages of the RF electrodes are set to maintain or increase the ion tilt angle.

Figure 2:
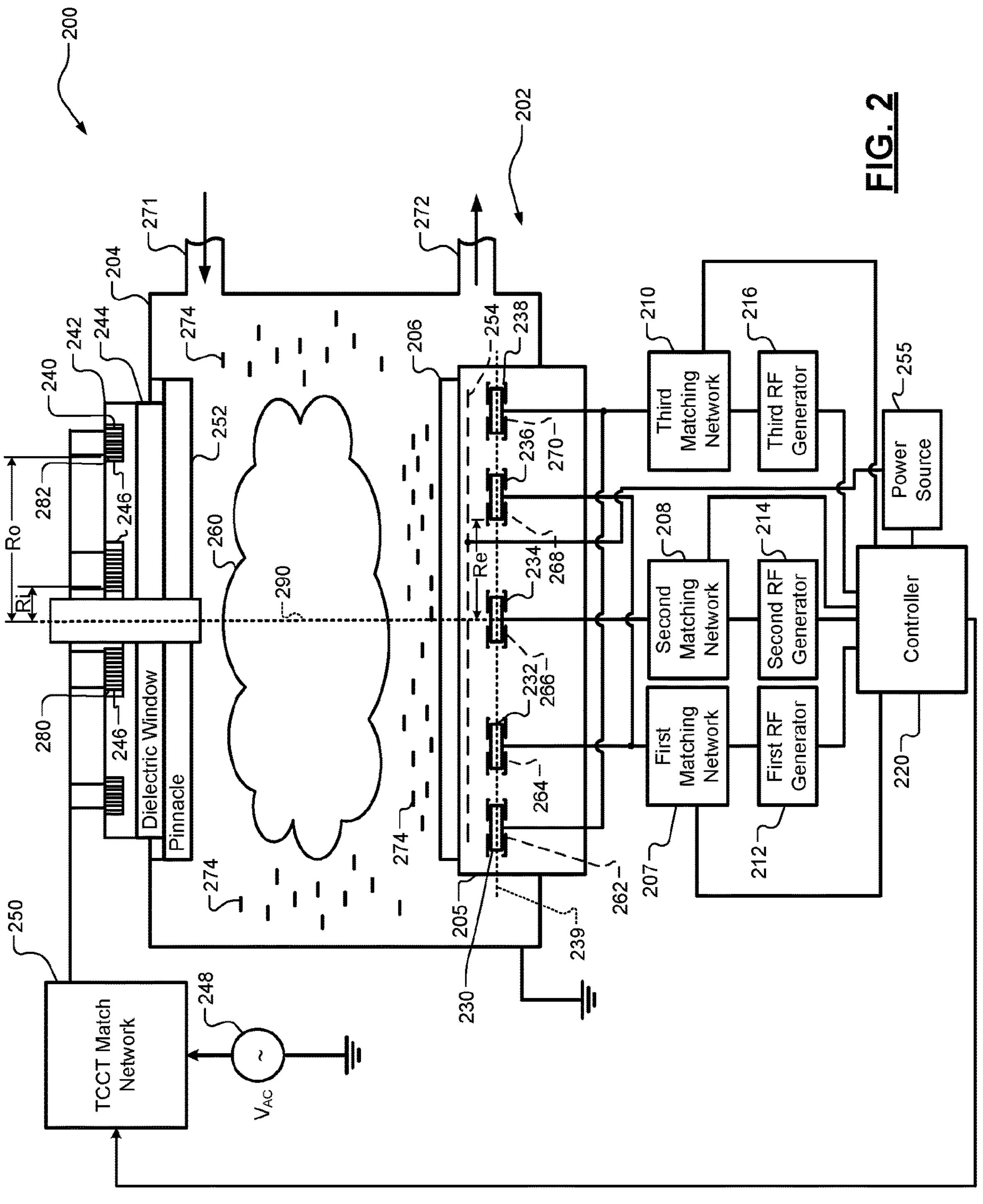
FIG. 2 is a functional block diagram of a first portion of an example substrate processing system including a plasma density profile control system in accordance with the present disclosure.

FIG. 2 shows a first portion 200 of an example substrate processing system including a plasma density profile control system 202. An example remainder portion of the substrate processing system is shown in FIG. 2. The substrate processing system includes a processing chamber 204. A substrate support 205 is at least partially disposed in the processing chamber 204 and is configured to hold a substrate 206. The plasma density profile control system 202 includes the substrate support 205, matching networks 207, 208, 210, RF generators 212, 214, 216 and a controller 220. The controller 220 controls the generators 212, 214, 216 to generate RF voltages at RF electrodes 230, 232, 234, 236, 238 via the matching networks 207, 208, 210. The RF electrodes 230, 232, 234, 236, 238 are implemented in the substrate support 205. FIG. 2 shows one example arrangement of RF electrodes. Other arrangements are shown in FIGS. 4, 5, 12, 14, 17, 26 and 27.

The substrate processing system further includes TCP reactor coils 240 disposed on a plenum 242 that is above a dielectric window 244. The plenum 242 may include multiple circular-shaped recessed areas (or channels) 246 in which the TCP reactor coils 240 (e.g., an inner coil set and an outer coil set) are disposed. A first power source 248 provides a first RF source signal to a transformer coupled capacitive tuning (TCCT) match network 250. The TCCT (or first) match network 250 is included between the first power source 248 and the TCP reactor coils 240. The TCCT match network 250 enables tuning of power provided to the TCP reactor coils 240. Examples TCP reactor coils and TCCT match networks are shown in U.S. Pat. No. 10,297,422, which is incorporated herein by reference.

The dielectric window 244 is located adjacent the plenum 242, above a pinnacle 252 and allows efficient transmission of the first RF source signal into the processing chamber 204 for plasma generation purposes. A pinnacle may refer to an upper liner of a processing chamber and be configured to support a dielectric window. The substrate support 205 is disposed at the bottom of the processing chamber 204. The substrate support 205 supports the substrate 206. If the substrate support 205 is an electrostatic chuck, the substrate support 205 includes one or more clamping electrodes 254. In one embodiment, the substrate support 205 is formed of a conductive material, such as aluminum. In another embodiment, the substrate support is formed of a non-conductive material, such as ceramic.

The substrate support 205 (or a portion thereof) may be capacitively coupled to the substrate 206. A clamping voltage may be supplied to the clamping electrode 254 by a power source 255, which is controlled by the controller 220. By applying a DC voltage to the clamping electrode 254, an electrostatic coupling is created between the substrate support 205 and the substrate 206. This electrostatic coupling attracts the substrate 206 against the substrate support 205.

As an example one of the RF generators 212, 214, 216 may be a bias RF power source and provide a bias voltage to a corresponding one or more of the RF electrodes 230, 232, 234, 236, 238. Each of the RF generators 212, 214, 216 may be connected to and supply a bias voltage to one or more electrodes. Although five electrodes are shown in FIG. 2, a different number of electrodes may be included. An example where each RF generator supplies a bias voltage to multiple electrodes is shown and described with respect to FIG. 26. The RF generator and matching network pair (or RF source) may supply an RF signal to a different set of electrodes than the other RF generator and matching network pair. In another embodiment, a first RF generator and matching network pair supplies a first RF signal to a first one or more electrodes and a second RF generator and matching network pair supplies a second RF signal to the same one or more electrodes. In one embodiment, there are a same amount of RF generator and matching network pairs (or RF sources) as there are sets of electrodes in the substrate support 205, where each set of electrodes includes one or more electrodes. In another embodiment, there are a different amount (more or less) of RF generator and matching network pairs (or RF sources) as there are sets of electrodes. The controller 220 may control which electrodes and how many electrodes are fed by each RF generator and matching network pair. This may be accomplished using a switching network, which may be included between the matching networks and the electrodes.

Figure 4:
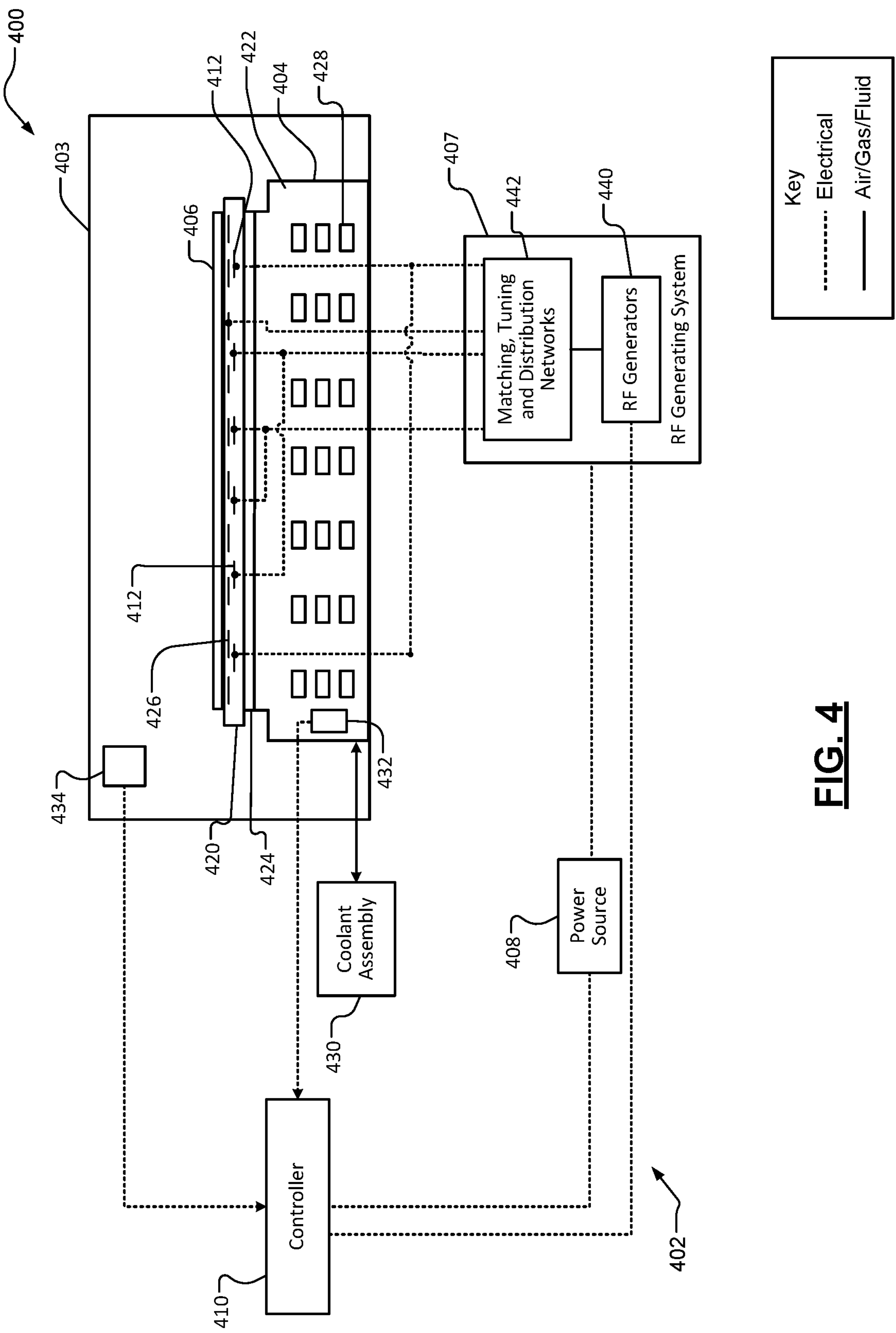
FIG. 4 is a functional block diagram of a portion of another substrate processing system including a plasma density profile control system in accordance with the present disclosure.

As an example, the switching network may be included in the matching, tuning and distribution networks 442 of FIG. 4. The RF generators may operate at different frequencies and/or implement different pulsing schemes with different pule durations and/or patterns when generating the RF signals. This may be controlled by the controller 220, which may select the RF frequency and/or pulsing pattern of each of the RF signals generated.

The electrodes 230, 232, 234, 236, 238 may be disposed in cavities, which are not shown in FIG. 2, but are shown in, for example, FIGS. 5, 12, 14, 17 and 27. A plane 239 may extend laterally through the RF electrodes 230, 232, 234, 236, 238. In one embodiment, the RF electrode 234 receives the bias RF voltage from the second matching network 208. The matching networks 207, 208, 210 match impedances (e.g., 500) of the generators 212, 214, 216 to impedances of the substrate support 205 and plasma 260 in the processing chamber 204 as seen at the matching networks 207, 208, 210. The electrodes 230, 232, 234, 236, 238 may be encased in dielectric material referred to as covers 262, 264, 266, 268, 270. In another embodiment, the electrodes 230, 232, 234, 236, 238 are not encased in a dielectric material. The controller 220 may control the voltage and/or current output of the RF generators 212, 214, 216 and parameter settings (e.g., impedances of circuit elements) of the matching networks 207, 208, 210.

In operation, a gas capable of ionization flows into the processing chamber 204 through the gas inlet 271 and exits the processing chamber 204 through the gas outlet 272. The first RF signal is generated by the RF power source 248 and is delivered to the TCP reactor coils 240. The first RF signal radiates from the TCP reactor coils 240 through the dielectric window 244 and into the processing chamber 204. This causes the gas within the processing chamber 204 to ionize and form the plasma 260. The plasma 260 produces a plasma sheath 274 along walls of the processing chamber 204. The plasma 260 includes electrons and positively charged ions. The electrons, being much lighter than the positively charged ions, tend to migrate more readily, generating DC bias voltages and DC sheath potentials at inner surfaces of the processing chamber 204. An average DC bias voltage and a DC sheath potential at the substrate 206 affects the energy with which the positively charged ions strike the substrate 206. This energy affects processing characteristics such as rates at which etching or deposition occurs.

The controller 220 may adjust the bias RF signal generated by, for example, the second RF generator 214 to change the amount of DC bias and/or a DC sheath potential at the substrate 206. The bias RF voltage may be supplied to a different electrode than the RF electrode 234. The controller 220 may also adjust the RF voltages supplied to the RF electrodes 230, 232, 234, 236, 238 to control a plasma density distribution profile above the substrate 206 and thus control etch rate uniformity across the substrate. The RF voltages may also be controlled to adjust the ion incidence angle as further described below. In an embodiment, the controller 220 controls provides RF signals via the matching networks 207, 208, 210 during startup of the RF generators 212, 214, 216. This may be done to improve etch rate uniformity during an initial transient period occurring at startup, as further described below.

In one embodiment, the controller 220 controls, as a coarse adjustment, power and/or current supplied to each of the coils 240. The radii of the coils 240 and/or locations of the coils 240 may also or alternatively be adjusted. Example radii Ri and Ro are shown for an inner coil set 280 and an outer coil set 282 and refer to inner radii of the innermost winding of the windings of the coils 240. The inner coil set 280 may include one or more coils and the outer coil set 282 may include one or more coils. Distances between the coil sets and the coils of each coil set may also be adjusted. The controller 220 also controls, as a fine adjustment, the RF signals provided to the RF electrodes 230, 232, 234, 236, 238. This may be done to meet stringent ion incidence angle and/or etch rate uniformity requirements. In one embodiment, the inner coil set 280 is disposed vertically opposite one or more RF electrodes in the substrate support 205 and the outer coil 282 set is disposed vertically opposite one or more other RF electrodes in the substrate support 205. A coil may be disposed vertically opposite an RF electrode when, for example, an inner radius of the coil measured from a centerline (e.g., centerline 290) of the processing chamber 204 is the same as a radial distance between the centerline and the RF electrode. A sample radial distance Re between the RF electrode 236 and the centerline 290 is shown.

Figure 3:
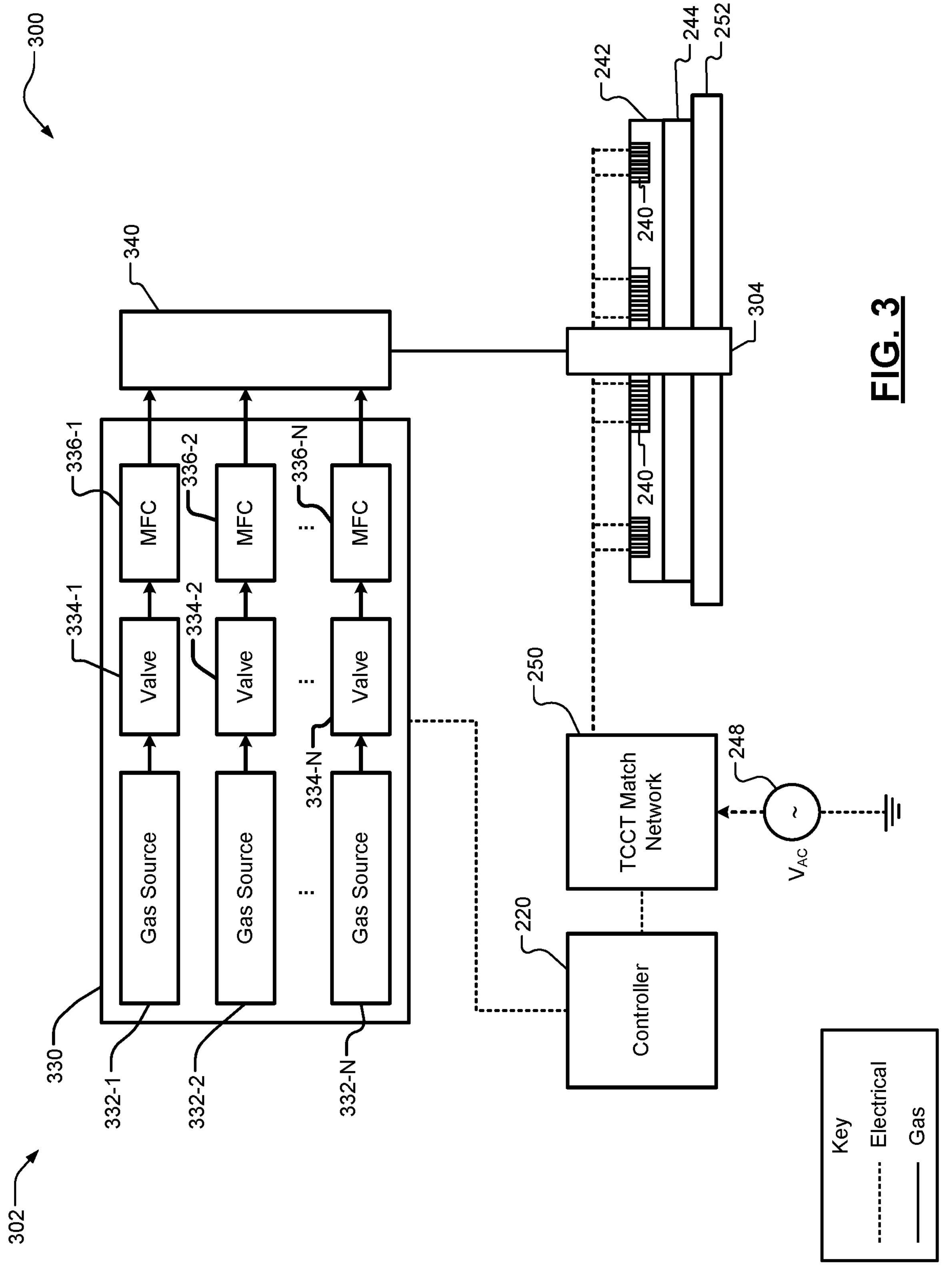
FIG. 3 is a functional block diagram of a second portion of the substrate processing system of FIG. 2.

FIG. 3 shows a second portion 300 of the substrate processing system, which includes a gas delivery system 302 for a gas injector 304. The TCP reactor coils 240 are disposed in channels of the plenum 242 and receive an RF signal from the power source 248 via the TCCT match network 250.

The gas delivery system 302 includes the controller 220 and a gas delivery assembly 330 including one or more gas sources 332-1, 332-2, . . . , and 332-N (collectively gas sources 332), where N is an integer greater than zero. The gas sources 332 supply one or more gases (e.g., etch gas, carrier gases, purge gases, etc.) and mixtures thereof. The gas sources 332 may also supply purge gas. The gas sources 332 are connected by valves 334-1, 334-2, . . . , and 334-N (collectively valves 334) and mass flow controllers 336-1, 336-2, . . . , and 336-N (collectively mass flow controllers 336) to a manifold 340. An output of the manifold 340 is fed to the processing chamber 204 of FIG. 1. For example only, the output of the manifold 340 injector 304. The controller 220 may control operation of the valves 334 and the mass flow controllers 336.

In one embodiment, source sets are configured to supply (i) compressed dry air to one or more central zones of the plenum 242, and (ii) air at atmospheric pressure to one or more middle zones and/or one or more outer zones of the plenum 242. In one embodiment, the air provided to the one or more middle zones and/or the one or more outer zones is amplified air provided via one or more air amplifiers. One or more of the mass flow controllers may include an air amplifier. The air amplifiers increase the volume of air supplied within a period of time.

FIG. 4 shows a portion of another substrate processing system 400 including a plasma density profile control system 402. The substrate processing system 400 includes a processing chamber 403 that includes a substrate support 404 that supports a substrate 406. The plasma density profile control system 402 includes the substrate support 404, an RF generating system 407, a power source 408 and a controller 410. The plasma density profile control system 402 controls a plasma density distribution profile across and above the substrate 406 by controlling RF signals sent to RF electrodes 412 disposed in the substrate support 404. The example of FIG. 4 is provided to show another example substrate support. Although not shown in FIG. 4, a plenum, dielectric window and coils may be included as shown in FIG. 2.

The substrate support 404 includes a top plate 420, a baseplate 422 and an intermediate bond layer 424. The top plate 420 may be formed of a non-conductive material such as ceramic and include one or more clamping electrodes 426 and the RF electrodes 412. Any number of clamping and RF electrodes may be included. The baseplate 422 may be formed of a conductive material, such as aluminum and include coolant channels 428. The coolant channels 428 may be supplied with a coolant via a coolant assembly 430, which may be controlled by the controller 410 based on signals from temperature sensors 432, 434. The temperature sensor 432 may be located in the substrate support 404. The temperature sensor 434 may be located in the processing chamber 403.

The RF generating system 407 includes RF generators 440 and matching, tuning and distribution networks 442, which may operate similarly as the RF generators 212, 214, 216 and matching networks 207, 208, 210 of FIG. 2. The RF generators 440 may receive power from the power source 408 and be controlled by the controller 410. Any number of RF generators, matching, tuning and distribution networks, and/or RF electrodes may be included. Each RF generator and matching, tuning and distribution network may be connected to any number of RF electrodes. The RF electrodes may be of different sizes and shapes and be arranged in various predetermined patterns.

The inner coils, outer coils, RF electrodes, bias electrodes, referred to herein may be supplied with the same or different voltages and/or with RF signals at same or different frequencies. As an example, the RF signals and bias signals supplied to the RF and bias electrodes may be 100 kilo-Hertz (kHz)-100 mega-Hertz (MHz) signals. The RF signals supplied to the inner and outer coils may be 1-13 MHz signals. In one embodiment, the RF signals supplied to the RF electrodes and the bias electrodes are at a same frequency. In another embodiment, the RF signals suppled to the RF electrodes and the bias electrodes are at different frequencies. The RF signals supplied to the RF electrodes may be at a same frequency, but different than a frequency of the RF signals supplied to bias (or bias RF) electrodes.

Figure 5:
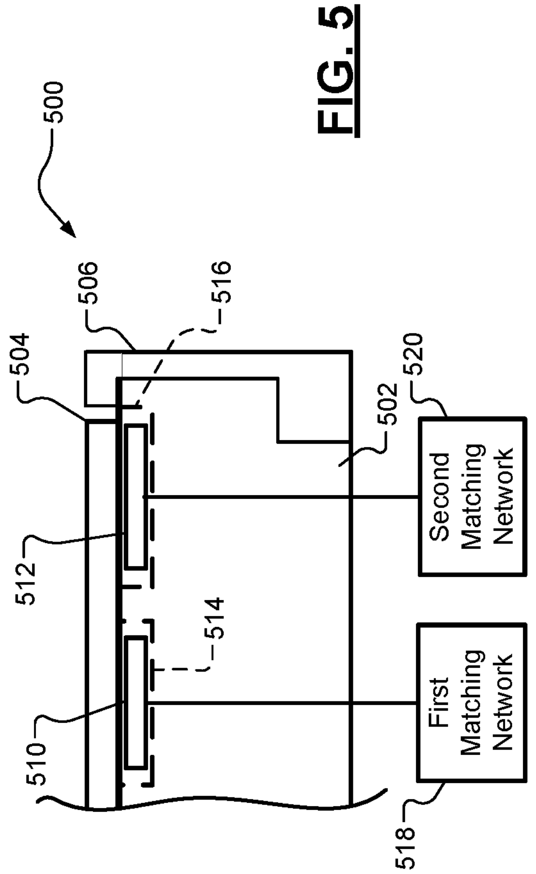
FIG. 5 is a cross-sectional view of an example of a portion of a substrate support including a radio frequency (RF) circuit with multiple RF zones in accordance with the present disclosure.

FIG. 5 shows a portion 500 of a substrate support including a RF circuit with multiple RF zones. The portion 500 includes a baseplate 502 supporting a substrate 504 and having one or more edge rings 506. The baseplate 502 may be referred to as a cathode and includes a first RF electrode 510, a second RF electrode 512, which may be disposed in cavities 514, 516. The cavities 514, 516 may be filled with air (or a dielectric) and/or dielectric material. The dielectric material may be referred to as covers of the electrodes 510, 512. When the cavities 514, 516 are filled with air, the electrodes 510, 512 may be spaced from the baseplate 502 via dielectric material. The electrodes 510, 512 are connected to respective matching networks 518, 520. The electrodes 510, 512 provide respective RF zones. Each of the RF electrodes 510, 512 may be provided with a different RF voltage, for example, Vb1 and Vb2 for the two respective zones. The RF electrode 510 provides a radially inner RF zone based on Vb1. The RF electrode 512 provides a radially outermost RF zone based on Vb2.

Figure 6:
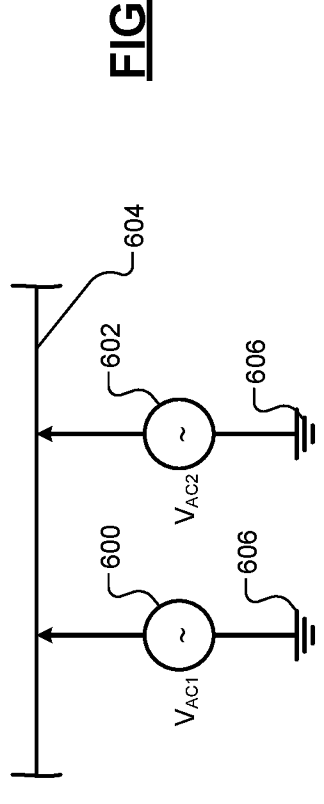
FIG. 6 is a RF circuit schematic representation of the portion of the substrate support of FIG. 5.

FIG. 6 shows a RF circuit schematic representation of the portion 500 of FIG. 5. The RF circuit includes two RF sources 600, 602 having respective RF voltages $V_{AC1}$ and $V_{AC2}$. The two RF sources 600, 602 provide the RF voltages $V_{AC1}$ and $V_{AC2}$ to a substrate 604 similar to the RF electrodes 510, 512, which provide respective voltages to the substrate 504. The two RF sources 600, 602 may be connected to a ground reference 606.

Figure 7:
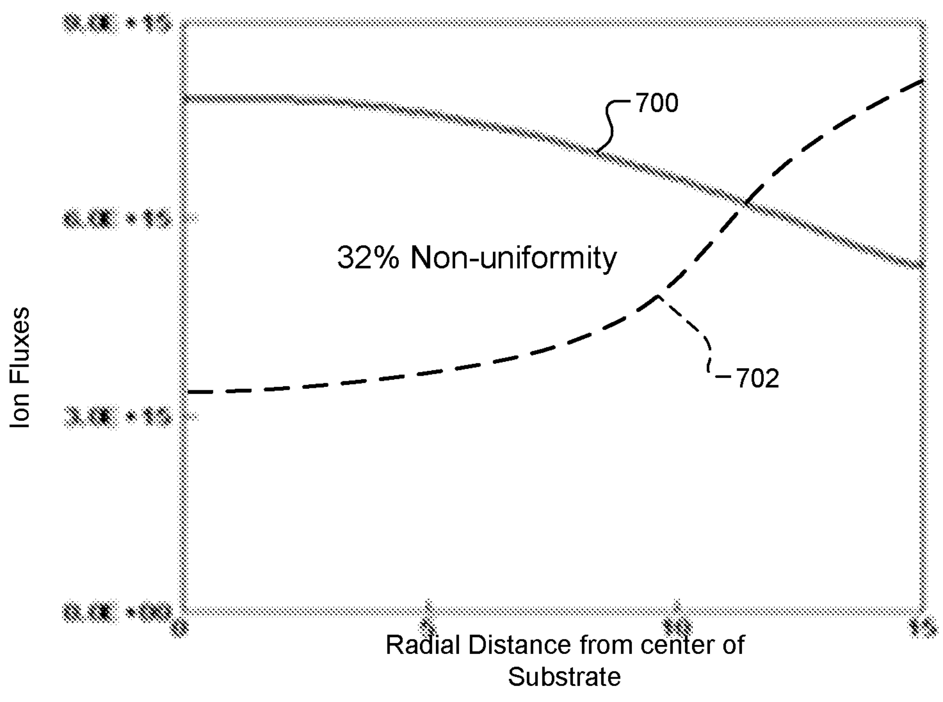
FIG. 7 is an example plot of ion fluxes and plasma density versus substrate radius for a substrate support void of RF electrodes.

FIG. 7 shows a plot of ion fluxes and plasma density versus substrate radius for a substrate support void of RF electrodes. Curve 700 is the ion fluxes versus substrate radius. Curve 702 is the plasma density versus substrate radius. For a substrate support void of RF electrodes, the flux is typically high near the center of the substrate and low near the radially outer edge of the substrate. The ion non-uniformity for the example of FIG. 7 is 32%, which may be estimated by using above equation 1, max ion flux at 0 centimeters (cm), and min ion flux at 15 cm. It is the opposite for plasma density, as shown. The plasma density curve is typically a mirror image of the ion flux curve. This holds true for the other ion flux plots referred to herein for which the plasma density curves are not shown.

Figure 8:
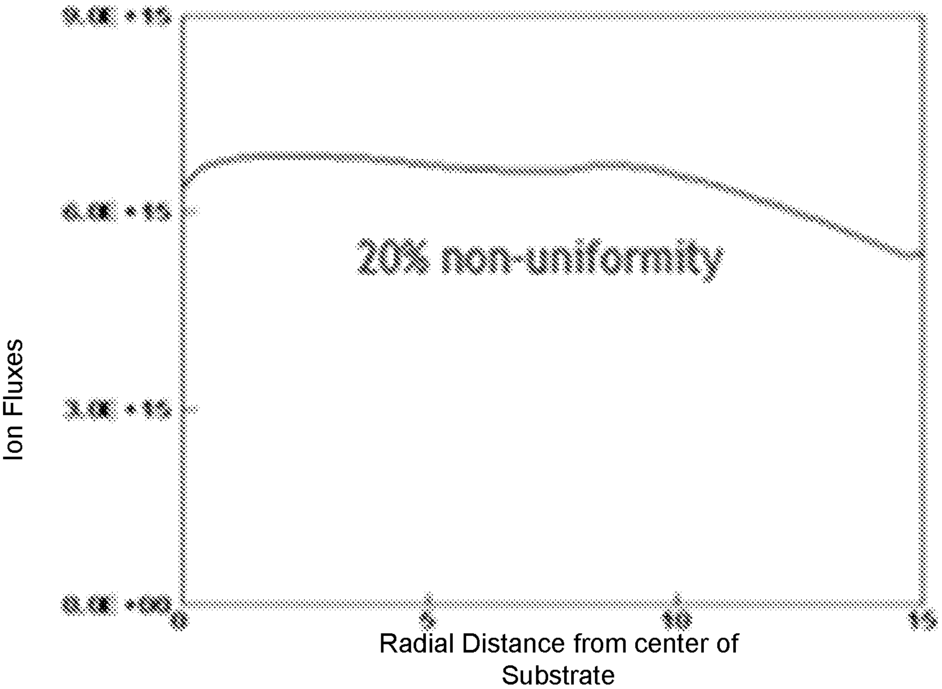
FIG. 8 is an example plot of ion fluxes versus substrate radius for the substrate support of FIG. 5 where a radially inner zone receives a higher RF voltage than a radially outer zone in accordance with the present disclosure.

In the example of FIG. 5, RF electrodes are disposed below a substrate. The RF electrodes may be supplied with RF voltages such that an electrode with a high Vb is under a high plasma density region and an electrode with a low Vb is under a low plasma density region. The higher potential of the electrode with the higher Vb causes some plasma from the high density region to move to the low density region above the RF zone with the lower Vb. This causes the plasma density distribution across the substrate to become more uniform. This is further illustrated by the example plot of FIG. 8, where the radially inner zone provided by the RF electrode 510 receives a higher Vb (e.g., 180V) than the RF electrode 512, which receives a lower Vb (e.g., 90V).

Figure 9:
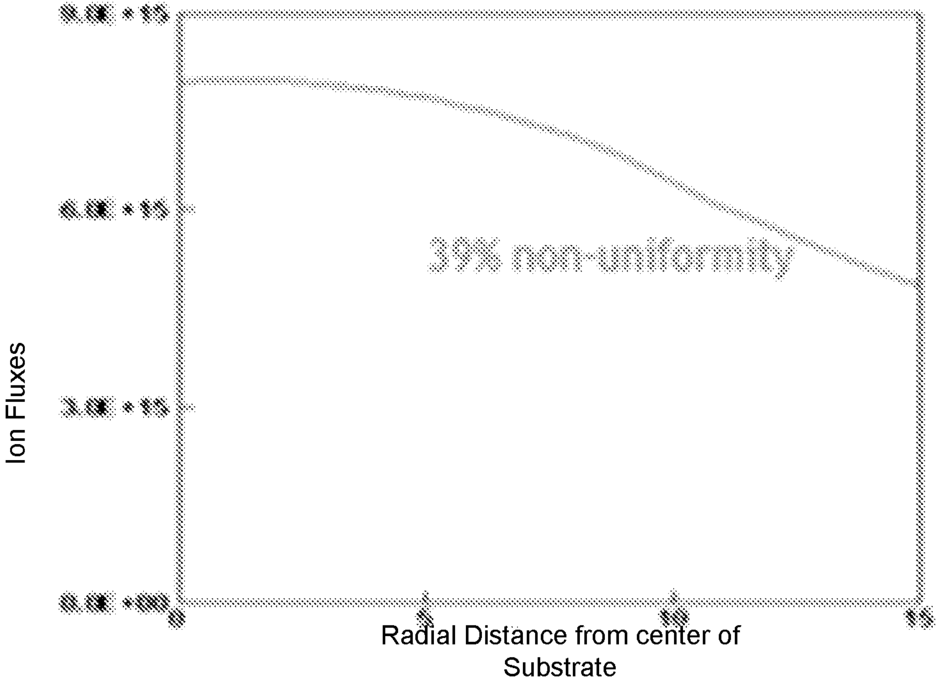
FIG. 9 is an example plot of ion fluxes versus substrate radius for the substrate support of FIG. 5 where the radially outer zone receives a higher RF voltage than the radially inner zone in accordance with the present disclosure.

Instead of improving plasma density uniformity, plasma density non-uniformity can further degrade such that flux increases near a center of the substrate (or becomes more center heavy). This is true if a higher Vb RF electrode is placed under a low plasma density and low flux region. In such an arrangement, the higher Vb RF electrode causes some plasma from the low plasma density region to move to the higher plasma density region making the plasma distribution profile more center heavy. For example, when the radially inner zone provided by the RF electrode 510 receives a lower RF voltage (e.g., 90V) than the radially outer zone, which receives a higher RF voltage (e.g., 180V) provided by the RF electrode 512, then uniformity degrades. This is shown in shown in FIG. 9.

A problem can exist when providing one RF electrode with a higher Vb than another RF electrode. Different regions of the substrate can have a different corresponding ion energy and thus different areas of the substrate experience different etch rates. FIGS. 10A and 10B show example plots of energy versus angle of spread of ions for two RF zones where the radially inner zone receives a higher RF voltage than the radially outer zone. FIGS. 11A and 11B show example plots of energy versus angle of spread of ions for two RF zones where the radially outer zone receives a higher RF voltage than the radially inner zone. In FIGS. 10A-11B, theta (θ) refers to the angle of spread of ions across a substrate and is equal to an inverse tangent of a square root of ion temperature Ti over a sheath voltage Vs, as represented by equation 2.

$$\theta = \tan^{-1}\sqrt{\frac{Ti}{Vs}} \tag{2}$$

Figures 12, 13:
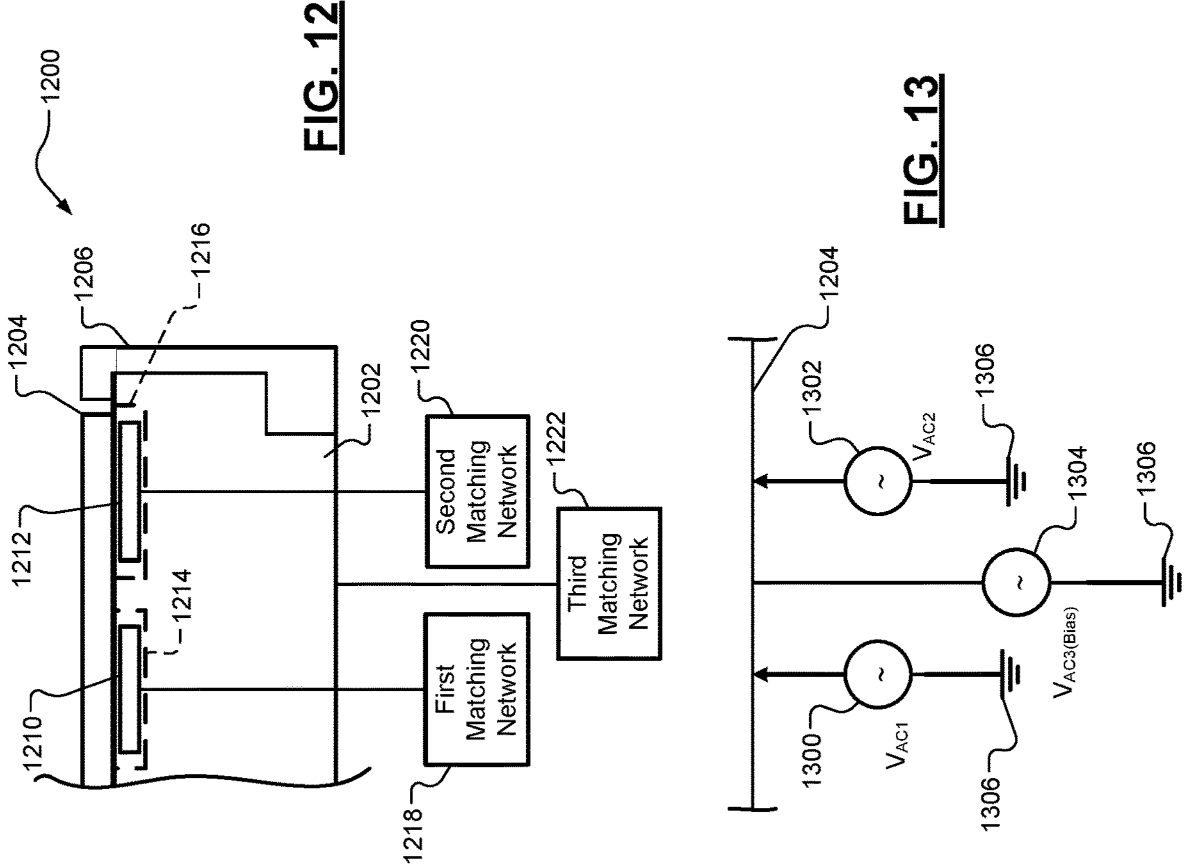
FIG. 12 is a cross-sectional view of an example of a portion of a substrate support including a RF circuit with multiple RF zones including a bias RF zone in accordance with the present disclosure.
FIG. 13 is a RF circuit schematic representation of the portion of the substrate support of FIG. 12.

FIG. 12 shows an example of a portion 1200 of a substrate support including a RF circuit with multiple RF zones including a bias RF zone. The portion 1200 includes a baseplate 1202 supporting a substrate 1204 and having one or more edge rings 1206. The baseplate 1202 may be referred to as a cathode and includes a first RF electrode 1210 and a second RF electrode 1212, which may be disposed in cavities 1214, 1216. The cavities 1214, 1216 may be filled with air and/or dielectric material. When the cavities 1214, 1216 are filled with air, the electrodes 1210, 1212 may be spaced from the baseplate 1202 via dielectric material. The dielectric material may encapsulate the electrodes 1210, 1212 and is referred to as covers. The electrodes 1210, 1212 are connected to respective matching networks 1218, 1220. Each of the RF electrodes 1210, 1212 may be provided with a different RF voltage, for example, Vb1 and Vb2. The baseplate 1202 may also operate as an RF electrode and receive a RF voltage from a third RF matching network 1222. The electrodes 1210, 1212 and the baseplate 1202 provide corresponding RF zones.

FIG. 13 shows a RF circuit schematic representation of the portion 1200 of the substrate support of FIG. 12. The RF circuit includes three RF sources 1300, 1302, 1304 having respective RF voltages $V_{AC1}$, $V_{AC2}$ and $V_{AC3(Bias)}$. The RF voltage $V_{AC3(Bias)}$ may be referred to as a bias RF voltage. The RF sources 1300, 1302, 1304 are connected to and provide respective RF voltages to the substrate 1204. The RF sources 1300, 1302, 1304 may be connected to a ground reference 1306. This arrangement of FIG. 12 has a similar issue as the arrangement of FIG. 5 in that different regions of the substrate 1204 can have a different corresponding ion energy and as a result different associated etch rates.

To improve etch rate uniformity, plasma uniformity and minimize ion tilt angle, (i) the radii of inner and outer coils, such as radii of the coils 240 of FIG. 2, may be altered, (ii) the power and/or current supplied to the inner and outer coils may be adjusted, (iii) the RF voltages provided to RF electrodes may be adjusted, and (iv) one or more dielectric layers and/or dielectric separators may be disposed above the RF electrodes to control voltage potentials provided to a substrate. This may be done such that similarity of ion energy across the substrate and uniformity of plasma density distribution across the substrate are able to be maintained. Examples of the stated ion energy is illustrated by FIGS. 20A-21B. The dielectric layers and/or dielectric separators are disposed between the RF electrodes and the substrate. The dielectric layers and/or dielectric separators may be integrated within a substrate support and/or may be disposed on the substrate support. With these stated adjustments and inclusions, ions across the substrate experience similar energy, which improves etch rate uniformity. Examples including dielectric layers and/or separators are shown in FIGS. 14, 17, 26 and 27.

Figures 14, 15:
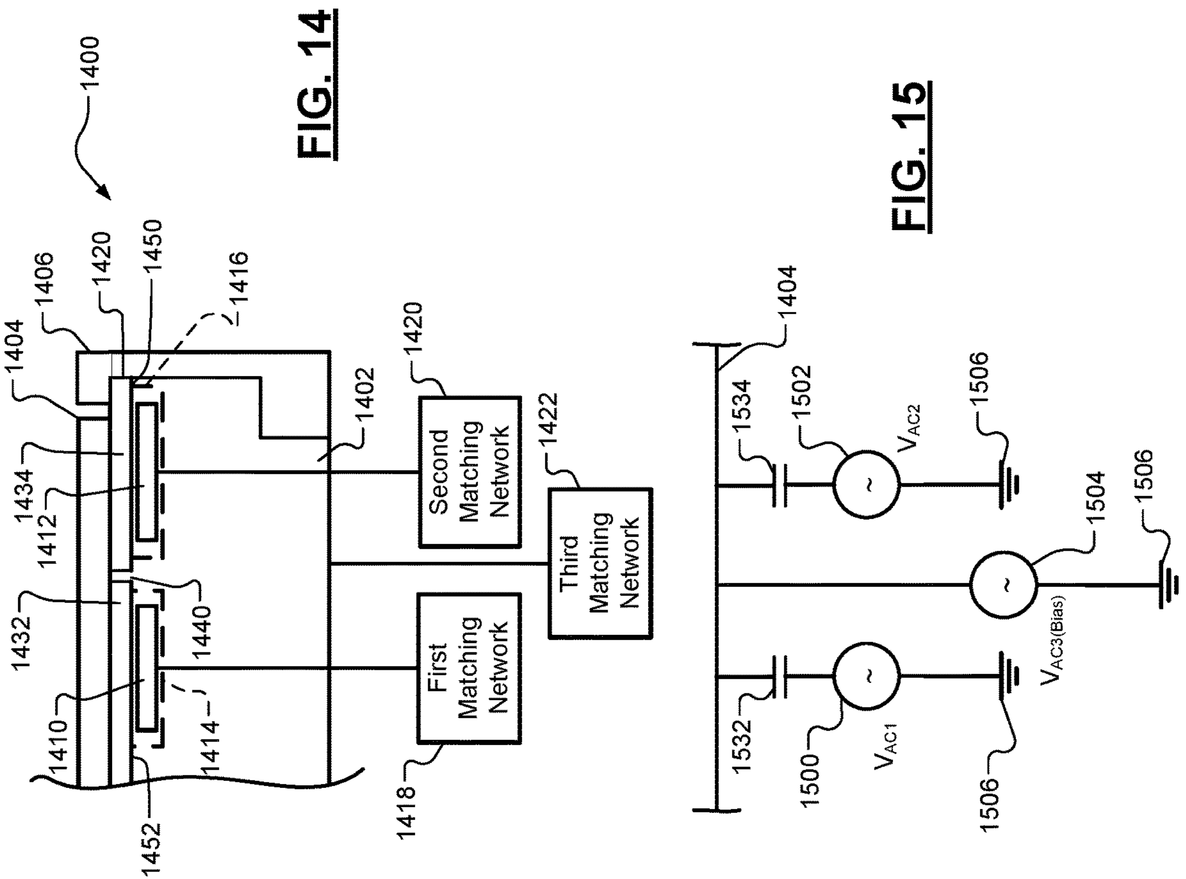
FIG. 14 is a cross-sectional view of an example of a portion of a substrate support including a RF circuit with multiple RF zones including a bias RF zone and a dielectric layer in accordance with the present disclosure.
FIG. 15 is a RF circuit schematic representation of the portion of the substrate support of FIG. 14.

FIG. 14 shows an example of a portion 1400 of a substrate support including a RF circuit with multiple RF zones including a bias RF zone and a dielectric layer. The portion 1400 includes a baseplate 1402 supporting a substrate 1404 and having one or more edge rings 1406. The baseplate 1402 may be referred to as a cathode and includes a first RF electrode 1410 and a second RF electrode 1412, which may be disposed in cavities 1414, 1416. The cavities 1414, 1416 may be filled with air and/or dielectric material to encapsulate the electrodes 1410, 1412. When the cavities 1414, 1416 are filled with air, the electrodes 1410, 1412 may be spaced from the baseplate 1402 via dielectric material. The dielectric material may be referred to as covers of the electrodes 1410, 1412.

The electrodes 1410, 1412 are connected to respective matching networks 1418, 1420. Each of the RF electrodes 1410, 1412 may be provided with a different RF voltage, for example, Vb1 and Vb2. The baseplate 1402 may also operate as an RF electrode and receive a RF voltage from a third RF matching network 1422. The electrodes 1410, 1412 and the baseplate 1402 provide corresponding RF zones (e.g., three RF zones).

The baseplate 1402 also includes a dielectric layer 1430. The dielectric layer 1430 may include multiple dielectric separators (dielectric separators 1432, 1434 are shown). A dielectric separator may refer to at least a portion of a layer of dielectric material disposed between an RF electrode and a substrate. In one embodiment, the dielectric separators are implemented as areas of the dielectric layer that include dielectric (or non-conductive) material. Other areas of the dielectric layer may include conductive material. For example, the area 1440 that is disposed between the dielectric separators 1432, 1434 may be formed of a conductive material (e.g., aluminum). The baseplate 1402 may include recessed areas (two recessed areas 1450, 1452 are shown) across a top of the baseplate in which the dielectric separators are disposed. The dielectric separators 1432, 1434 and the covers may be formed of a same material and have same or similar impedances or may be formed of different materials and have different impedances. This holds true for other dielectric separators and covers of other embodiments disclosed herein. In one embodiment, the dielectric separator 1432 is formed of a different dielectric material than the dielectric separator 1434.

In one embodiment, the baseplate 1402 is formed of conductive material (e.g., aluminum). A portion of the conductive material may be disposed between the dielectric separators 1432, 1434 and the covers (or dielectric covers). In the shown embodiment, the dielectric covers are in contact with the dielectric separators 1432, 1434 and no conductive material is disposed between the dielectric covers and the dielectric separators 1432, 1434.

FIG. 15 shows a RF circuit schematic representation of the portion 1400 of the substrate support of FIG. 14. The RF circuit includes three RF sources 1500, 1502, 1504 having respective RF voltages $V_{AC1}$, $V_{AC2}$ and $V_{AC3(Bias)}$. The RF sources 1500, 1502, 1504 are connected to and provide respective RF voltages to a substrate 1404. The RF sources 1500, 1502, 1504 may be connected to a ground reference 1506. The dielectric separators 1432, 1434 of FIG. 14 are represented by capacitors 1532, 1534, which are connected in series with the RF sources 1500 and 1502.

The dielectric separator 1432 and the RF source 1500 operate as a first voltage divider. The dielectric separator 1434 and the RF source 1502 operate as a second voltage divider. When powered up, the RF voltages seen at the substrate as provided by the voltage dividers and the third RF source 1504 may be different depending on the voltages of the RF sources 1500, 1502, 1504 and the materials of the dielectric separators.

Figure 16:
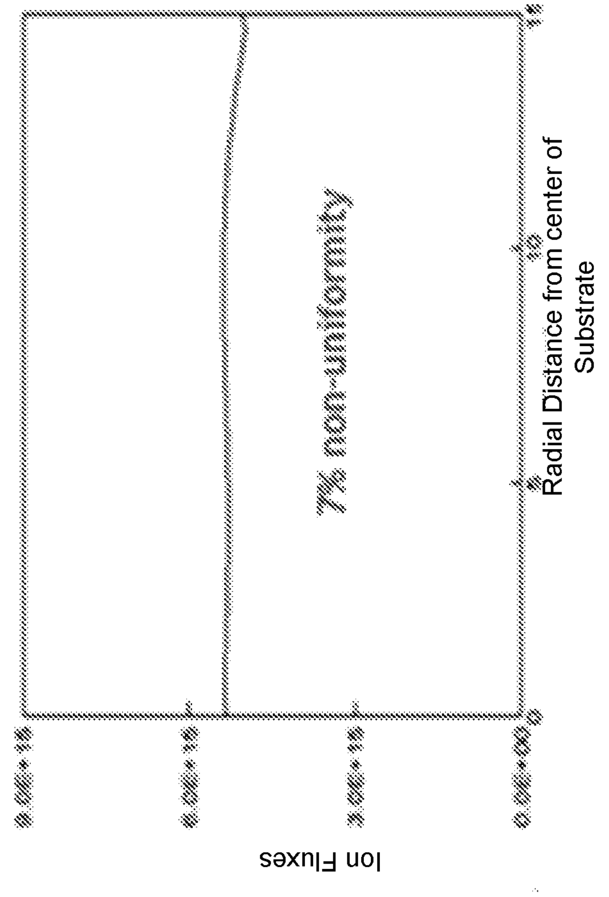
FIG. 16 is an example plot of ion fluxes versus substrate radius for the substrate support of FIG. 14.

FIG. 16 shows an example plot of ion fluxes versus substrate radius for the substrate support of FIG. 14. For the example plot of FIG. 16, the plasma non-uniformity is 7%, but may be less. For the example plot of FIG. 16, the voltage of the first RF source 1500 is 600V and the voltage of the second RF source 1502 is 300V.

Figure 17:
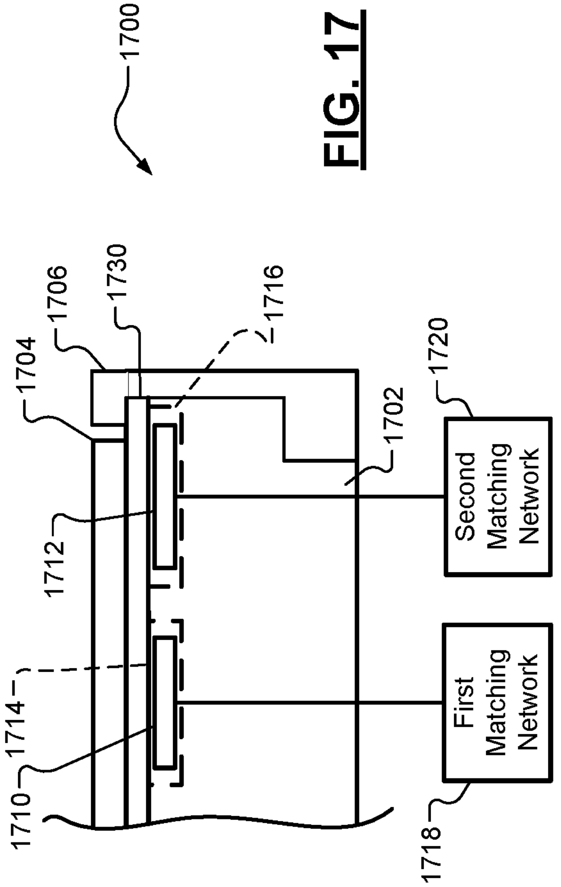
FIG. 17 is a cross-sectional view of an example of a portion of a substrate support including a RF circuit with multiple RF zones with no bias RF electrode and a dielectric layer in accordance with the present disclosure.

FIG. 17 shows an example of a portion of a substrate support including a RF circuit with multiple RF zones with no bias RF electrode and a dielectric layer. The portion 1700 includes a baseplate 1702 supporting a substrate 1704 and having one or more edge rings 1706. The baseplate 1702 may be referred to as a cathode and includes a first RF electrode 1710 and a second RF electrode 1712, which may be disposed in cavities 1714, 1716. The cavities 1714, 1716 may be filled with air and/or dielectric material to encapsulate the electrodes 1710, 1712. When the cavities 1714, 1716 are filled with air, the electrodes 1710, 1712 may be spaced from the baseplate 1702 via dielectric material. The dielectric material may be referred to as covers. The electrodes 1710, 1712 are connected to respective matching networks 1718, 1720. Each of the RF electrodes 1710, 1712 may be provided with a different RF voltage, for example, Vb1 and Vb2. In this example, the baseplate 1702 is not provided directly with a RF voltage, such as a RF bias voltage. The electrodes 1710, 1712 provide corresponding RF zones (e.g., two RF zones). The baseplate 1702 also includes a dielectric layer 1730, which covers a top surface of the baseplate 1702. The dielectric layer 1730 is formed of a non-conductive material, which may be the same or different than the material of the covers.

Figure 18:
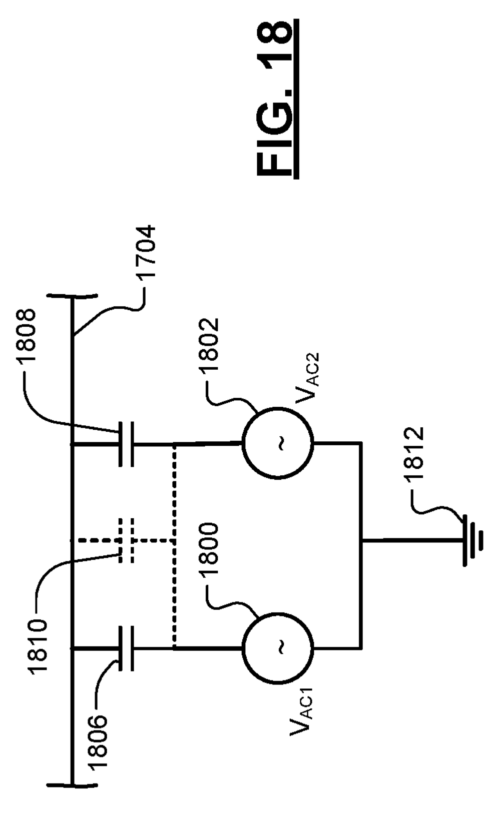
FIG. 18 is a RF circuit schematic representation of the portion of the substrate support of FIG. 17.

FIG. 18 shows a RF circuit schematic representation of the portion of the substrate support of FIG. 17. The RF circuit includes two RF sources 1800, 1802 that have respective RF voltages $V_{AC1}$, $V_{AC2}$. Initially when powered up, the dielectric layer 1730 of FIG. 17 is mostly shorted and becomes more of an open circuit with time. As a result, initially the equivalent RF circuit representation may include capacitors 1806 and 1808 and over time include capacitor 1810 and not capacitors 1806, 1808. Thus, initially two different RF voltages are provided to the substrate 1704 via multiple areas of the dielectric layer 1730 (represented by the capacitors 1806, 1808) and over time and as the arrangement approaches steady-state, a single RF voltage is provided via the dielectric layer 1730 (represented by the capacitor 1810). The RF sources 1800, 1802 are connected to a ground reference 1812.

The capacitors 1806, 1808 and the RF sources 1800, 1802 operate initially as two voltage dividers and with time, the capacitor 1810 and the parallel connected RF sources 1800, 1802 operate as a single voltage divider. When powered up, the RF voltages seen at the substrate as provided by the two voltage dividers may be different. This may be true for 200-900 milliseconds and/or until a steady-state condition arises at the substrate. By setting and providing different voltages during this initial period, the corresponding plasma density profile is controlled to provide improved ion tilt angle and improved etch rate uniformity across the substrate during this initial period. Similar differences in voltages may also be seen at substrates during initial transient periods for other embodiments disclosed herein. The differences in voltages may be provided by RF electrodes and/or bias RF electrodes.

Figure 19:
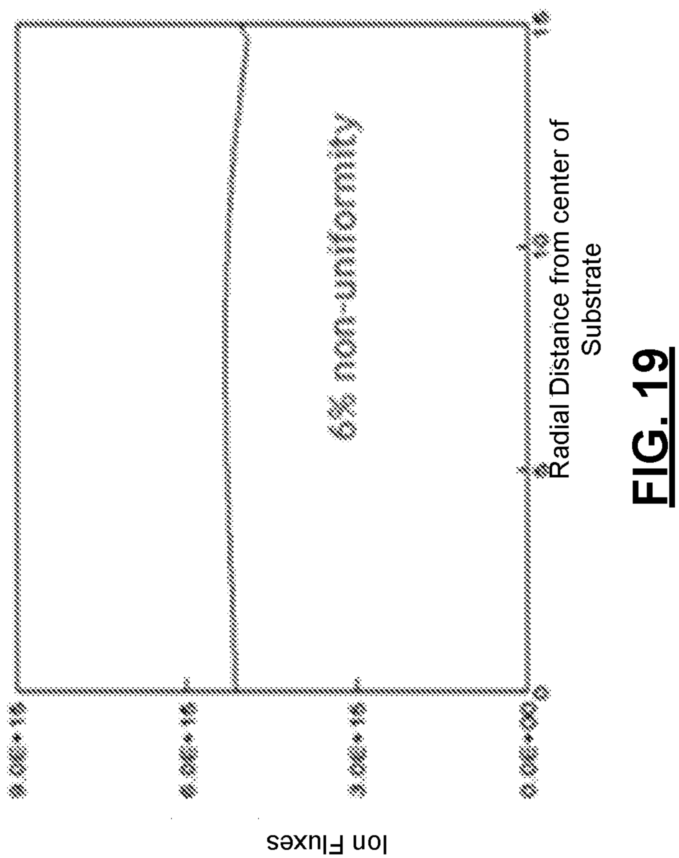
FIG. 19 is an example plot of ion fluxes versus substrate radius for the substrate support of FIG. 17.

FIG. 19 shows an example plot of ion fluxes versus substrate radius for the substrate support of FIG. 17. For the example plot of FIG. 19, the plasma non-uniformity is 6%, but may be less. For the example plot of FIG. 19, the voltage of the first RF source 1800 is 600V and the voltage of the second RF source 1802 is 300V.

Providing two or three RF zones and one or more dielectric layers and/or separators as provided by the examples of FIGS. 14 and 17, ions can have similar potential across a wafer, as illustrated in FIGS. 20A-21B. FIGS. 20A and 20B correspond to the arrangement of FIG. 14. FIGS. 21A and 21B correspond to the arrangement of FIG. 17. FIGS. 20A and 20B show plots of energy versus angle of spread of ions for two RF zones provided by RF electrodes 1410, 1412 of the substrate support of FIG. 14. FIGS. 21A and 21B show plots of energy versus angle of spread of ions for two RF zones provided by RF electrodes 1710, 1712 of the substrate support of FIG. 17. The arrangements of FIGS. 14 and 17 in combination with adjusting radii of inner and outer coils (e.g., the coils 240 of FIG. 2) and/or adjusting power, voltage and/or current supplied to the coils 240 improves plasma density profile uniformity and as a result etch rate uniformity across a substrate. As an example, the amount of current supplied to the outer coil may be twice as large as an amount of current supplied to the inner coil, such that the TCCT ratio is 0.5.

Figure 22:
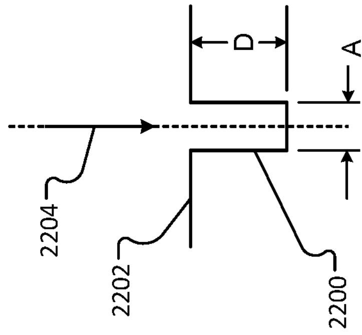
FIG. 22 is a side view of a feature of a substrate illustrating perpendicular angular incidence of ions and aspect ratio parameters.

FIG. 22 shows a feature 2200 of a substrate 2202 illustrating perpendicular angular incidence of ions and aspect ratio parameters. The feature has a width A and a depth D. The aspect ratio is equal to the depth D divided by the width A. The incidence angle is 0°, such that the direction of the ions (represented by vector 2204) hitting the substrate is perpendicular to the surface of the substrate 2202.

Figure 23:
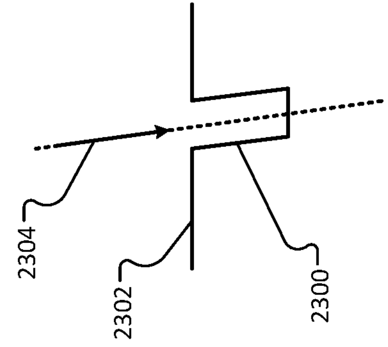
FIG. 23 is a side view of a feature created with acute angular ion incidence.
Figures 24A, 24B:
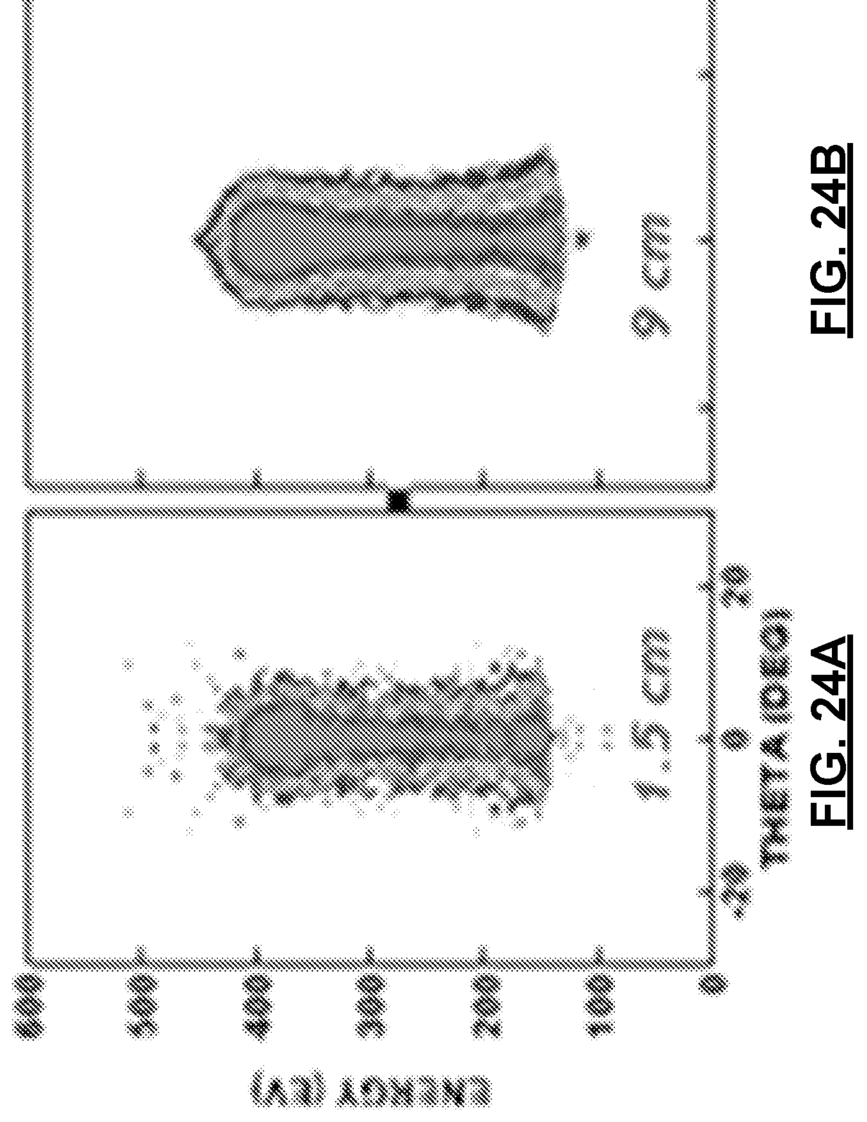
FIGS. 24A and 24B are example plots of energy versus angle of spread of ions for two RF zones provided by the substrate support of FIG. 17 where a center potential is significantly higher than an edge potential in accordance with the present disclosure.

FIG. 23 shows a feature 2300 of a substrate 2302 created with acute angular ion incidence, represented by vector 2304. When this occurs, continued etching at this acute ion incidence angle may be requested. In order to continue etching at this angle, a shift in plasma may be needed. This acute ion incidence angle may be provided using the arrangements of FIGS. 14 and 17 by supplying a high RF voltage in the center (or first) RF zone and applying a low RF voltage in the outer (or second) RF zone. The outer zone may refer to a zone near a peripheral edge of a substrate. In addition, a corresponding outer coil set (e.g., outer coil set 282 of FIG. 2) receives more power than a corresponding inner coil set (e.g., the inner coil set 280 of FIG. 2). This provides edge heavy plasma with equal ion energy across the substrate. The ion energy is shown in FIGS. 24A and 24B. FIGS. 2A and 24B show example plots of energy versus angle of spread of ions for two RF zones provided by the substrate support of FIG. 17 where center potential is significantly higher than edge potential.

Figure 25:
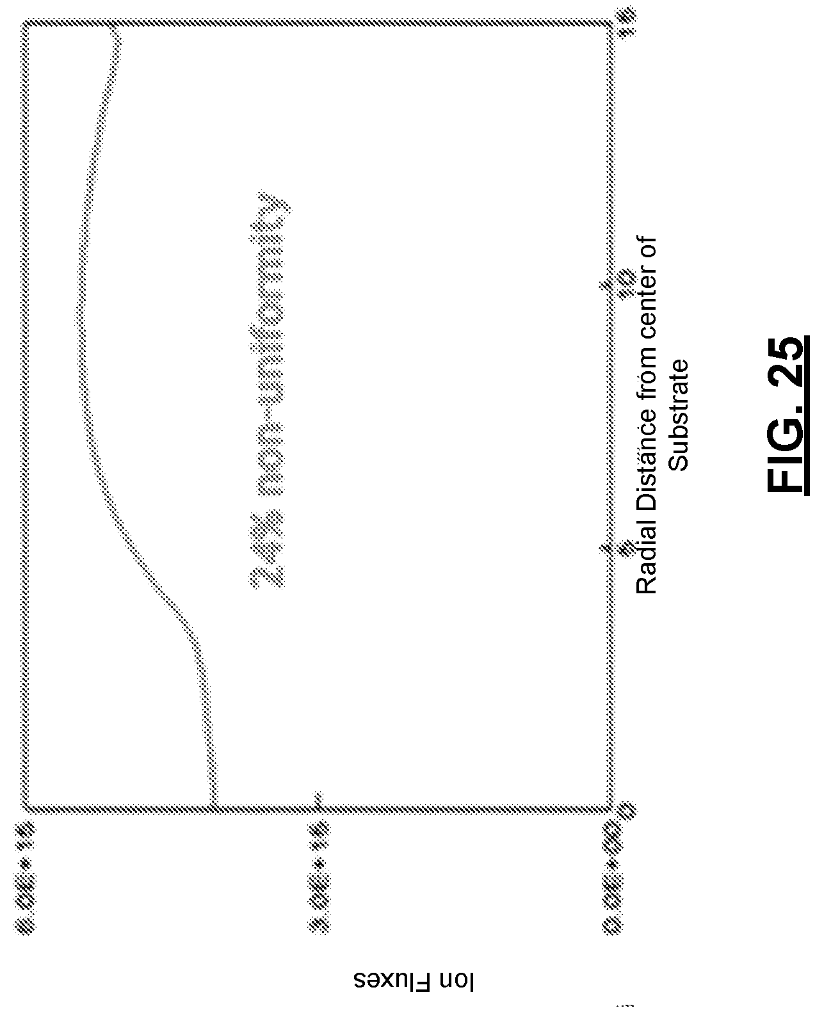
FIG. 25 is an example plot of ion fluxes versus substrate radius for the substrate support of FIG. 17 where a center potential is significantly higher than an edge potential in accordance with the present disclosure.

FIG. 25 shows an example plot of ion fluxes versus substrate radius for the substrate support of FIG. 17 where center potential is significantly higher than edge potential. In the example shown, the radially inner zone receives 900V and the radially outer zone receives 180V with a TCCT ratio of 0.5 and an edge heavy plasma, where the plasma density non-uniformity is 24% across a top surface of the substrate.

Figure 26:
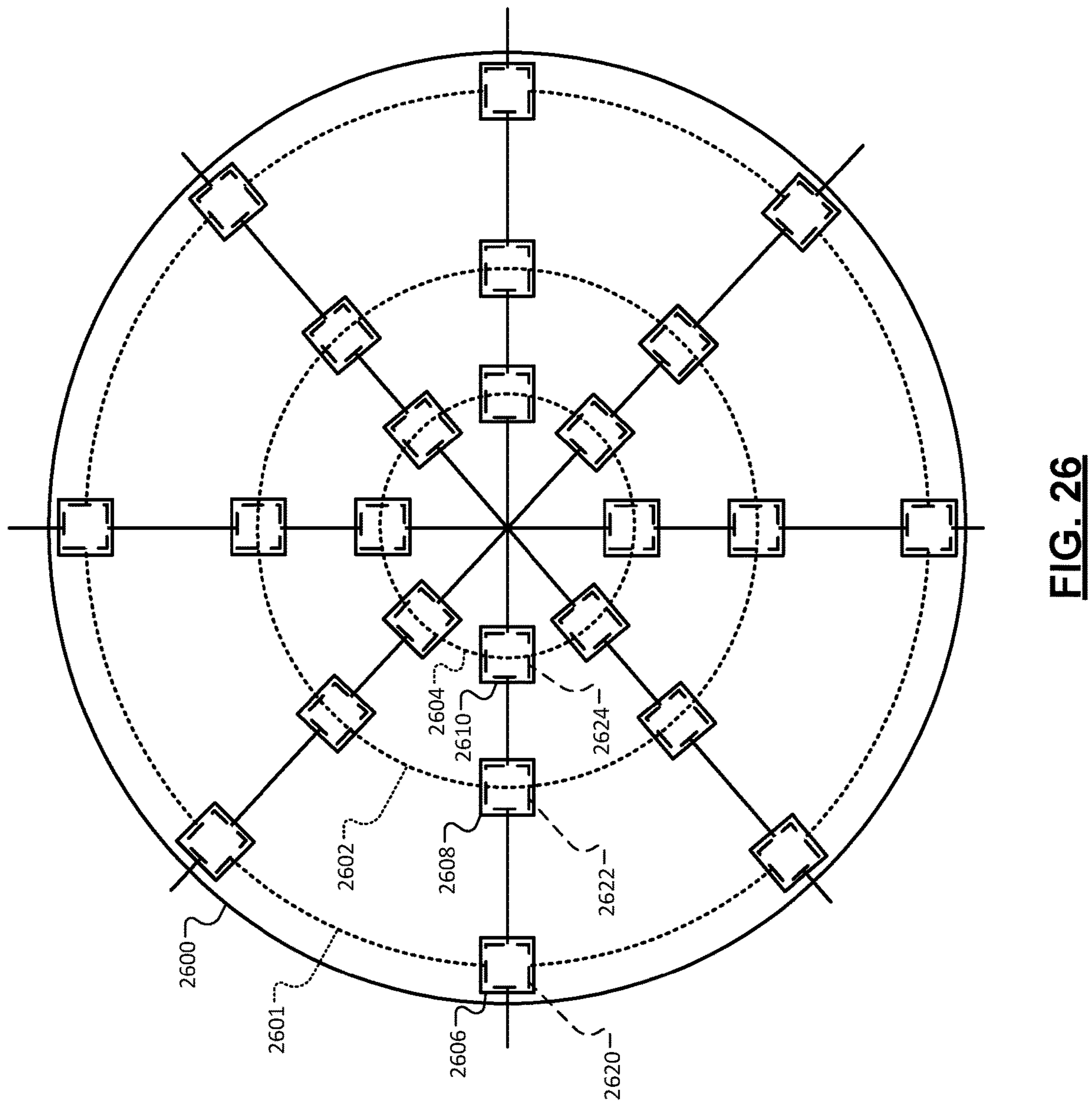
FIG. 26 is a top view of a baseplate of a substrate support including RF electrodes arranged in multiple RF zones in accordance with the present disclosure.

FIG. 26 shows a top view of a baseplate 2600 of a substrate support. In the example shown, three rings 2601, 2602, 2604 of RF electrodes 2606, 2608, 2610 are shown and may be embedded in the baseplate 2600. Any number of rings of RF electrodes may be included and each ring may have any number of RF electrodes. An example pattern of RF electrodes is shown. Other patterns may be implemented. Each of the rings 2601, 2602, 2604 may refer to a particular RF zone and/or include multiple different RF zones. The RF electrodes 2606, 2608, 2610 may be independently supplied respective RF voltages. In one embodiment, the RF electrodes in each of the rings 2601, 2602, 2604 receive the same RF voltage and the RF electrodes in different ones of the rings 2601, 2602, 2604 receive different RF voltages. Although the RF electrodes 2606, 2608, 2610 are shown as being arranged in rings, the RF electrodes 2606, 2608, 2610 may be in other arrangements and may each have a different size and/or shape than shown. The RF electrodes may have the same size and shape as shown or may have different sizes and shapes.

In one embodiment, each of the rings 2601, 2602, 2604 correspond to one of the RF zones of the example of FIG. 14. For example, a first one of the rings 2601, 2602, 2604 provides the first RF zone, a second one of the rings 2601, 2602, 2604 provides the second RF zone and a third one of the rings 2601, 2602, 2604 provides the third RF zone. In one embodiment, the third RF zone receives a bias RF voltage provided by the center ring 2602, where the bias RF voltage is provided to the RF electrodes 2608 and not to the baseplate of the substrate support. In another embodiment, the bias RF voltage is provided to the RF electrodes of the radially innermost ring 2604 or the RF electrodes of the radially outermost ring 2601. In one embodiment the RF electrodes of the rings are encased in dielectric material (or covers) as described above and surrounded by conductive material.

Each of the RF electrodes 2606, 2608, 2610 may have respective dielectric separators 2620, 2622, 2624. The dielectric separators 2620, 2622, 2624 may be non-conductive "islands" separated by and/or surrounded by conductive material and disposed above the RF electrodes 2606, 2608, 2610 or may be upper portions of dielectric covers encasing the RF electrodes 2606, 2608, 2610. In an embodiment, the dielectric separators 2620, 2622, 2624 may be in contact with a substrate when the substrate is disposed on the substrate support. In another embodiment, the substrate support and/or baseplate may include a layer of conductive or nonconductive material disposed between the dielectric separators and the substrate.

In yet another embodiment, a single dielectric layer replaces the dielectric separators 2620, 2622, 2624 and covers the baseplate 2600 of the corresponding substrate support. In still another embodiment, a single uniform dielectric layer covers all of the RF electrodes 2606, 2608, 2610 and is disposed between the RF electrodes 2606, 2608, 2610 and a substrate. The dielectric layer may be the uppermost layer of the baseplate and/or substrate support or may be an intermediate layer of the baseplate and/or substrate support.

In another embodiment, one or more of the RF electrodes 2606, 2608, 2610 and/or one or more of the rings 2601, 2602, 2604 of RF electrodes are configured to operate as heating elements in addition to providing a RF voltage to a substrate. For example, the RF electrodes of one of the rings 2601, 2602, 2604 (e.g., the outer ring 2601) are supplied with a low frequency current as well as a high frequency RF current to operate as both heating elements and as RF sources. As an example, the power source 255 of FIG. 2 may supply low frequency current to the RF electrodes that are operating as heating elements. The RF electrodes may receive the low frequency power while receiving high frequency RF signals. The controller 220 of FIG. 2 may adjust the current to the heating elements based on, for example, temperature signals from temperature sensors (e.g., the temperature sensors 432, 434 of FIG. 4).

Figure 27:
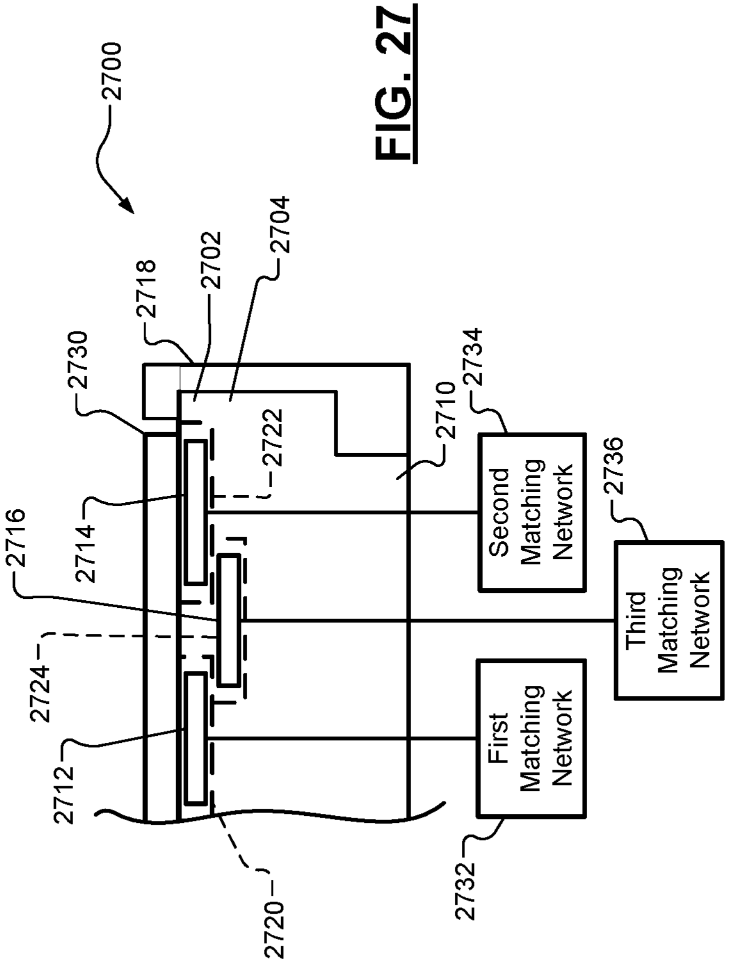
FIG. 27 is a cross-sectional view of an example of a portion of a substrate support including multiple layers of RF electrodes for multiple RF zones in accordance with the present disclosure.

FIG. 27 shows an example of a portion 2700 of a substrate support including multiple layers 2702, 2704 of RF electrodes for multiple RF zones. The substrate support includes a baseplate 2710 that includes RF electrodes 2712, 2714, 2716 arranged in the layers 2702, 2704 and one or more edge rings 2718. The layers 2702, 2704 may include any number of RF electrodes in various patterns. The RF electrode 2716 may be disposed below one or more of the RF electrodes 2712, 2714 or may be horizontally offset to be in a layer below the RF electrodes 2712, 2714, but not directly below the RF electrodes 2712, 2714.

The RF electrodes 2712, 2714, 2716 may be disposed in cavities 2720, 2722, 2724 and surrounded by air and/or encased in dielectric material (referred to as covers). When the cavities 2720, 2722, 2724 are filled with air, the electrodes 2712, 2714, 2716 may be spaced from the baseplate 2710 via dielectric material. A dielectric material may be disposed between and separate the cavities 2720, 2722, 2724. In another embodiment, the RF electrodes 2712, 2714, 2716 are not encased in a dielectric material. A substrate 2730 is disposed on the substrate support above the RF electrodes 2712, 2714, 2716. The RF electrodes 2712, 2714, 2716 receive RF voltages via matching networks 2732, 2734, 2736.

Although the RF electrode examples of FIGS. 14, 17, 26, 27 are shown as being implemented in a baseplate of a substrate support, the RF electrodes may be implemented in a top plate (e.g., the top plate 420 of FIG. 4) of a substrate support.

The examples disclosed herein allow the plasma density distribution profile laterally across a substrate to be controlled. Inner and outer coil parameters, RF electrode parameters and/or dielectric separator parameters are able to be adjusted to either (i) provide a more uniform plasma density distribution across the substrate, or (ii) provide a center heavy or radial outer edge heavy plasma density (or ion fluxes on substrate) distribution profile. A center heavy distribution refers to when there is higher plasma density near a center area of a substrate as compared to a radially outer edge of the substrate. A radial outer edge heavy distribution refers to when there is higher plasma density near a radial outer edge of a substrate as compared to a center area of the substrate.

The inner and outer coil parameters may include: radii of the inner and outer coils; locations of the inner and outer coils relative to reference point of a processing chamber and/or relative to each other; power, voltage and/or current supplied to the inner and outer coils; etc. The RF electrode parameters may include: power, voltage and/or current supplied to the RF electrodes; sizes and shapes of the RF electrodes; number of RF electrodes per RF zone; number of RF zones of the RF electrodes; locations of the RF electrodes; etc. The dielectric separator parameters may include: size and shape of the dielectric separators; number of dielectric separators; materials of the dielectric separators; locations of the dielectric separators; etc.

Figure 28:
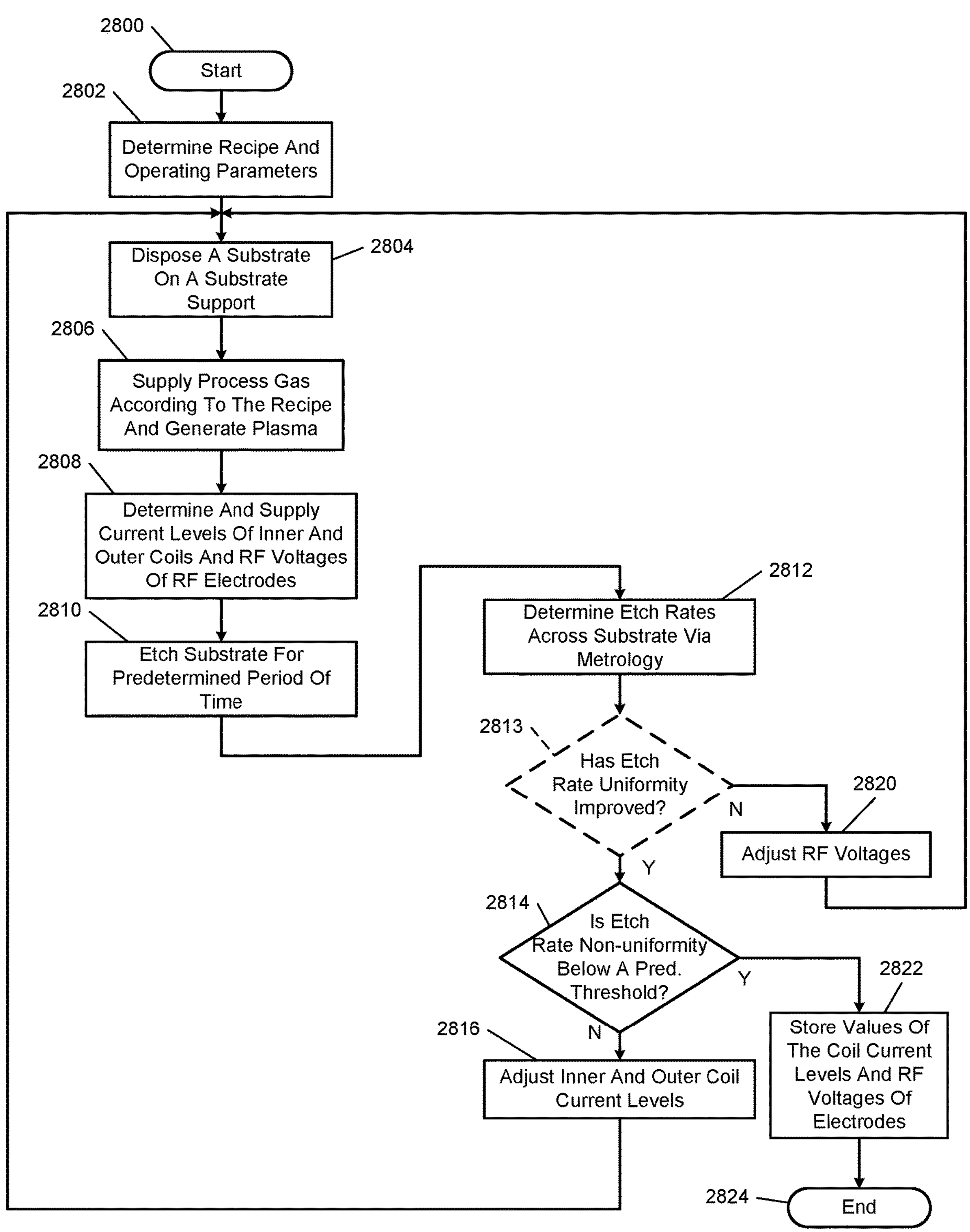
FIG. 28 illustrates a method of adjusting etch rate uniformity in accordance with an embodiment of the present disclosure.

FIG. 28 shows a method of adjusting etch rate uniformity. The method is applicable to the systems of FIGS. 2-4 and the embodiments of FIGS. 5, 12, 14, 17, 26 and 27 and other embodiments disclosed herein. At least some of the following operations may be implemented by the controller 220 of FIG. 2 and iteratively performed. The method may begin at 2800. At 2802, the controller 220 may determine a recipe and operating parameters. At 2804, a substrate is disposed on a substrate support (e.g., one of the above-described substrate supports). At 2806, process gas is supplied to a processing chamber according to the recipe and plasma is generated.

At 2808, the controller 220 may (i) determine current levels specified by the determined recipe and supply the corresponding amount of current to the inner and outer coils 240, and (ii) determine RF voltage levels specified by the determined recipe and supply the determined RF voltages to RF electrodes of the substrate support. At 2810, the controller 220 etches the substrate for a predetermined period of time.

At 2812, a metrology process may be performed to determine etch rates across the substrate. This may include evacuating the processing chamber, removing the substrate and measuring features of the substrate. Etch depths and/or feature dimensions across the substrate may be measured and recorded for comparison with other previous measured dimensions of the substrate.

At 2813, the controller 220 may determine whether etch rate uniformity has improved. The controller 220 may compare current etch depths and/or feature dimensions across the substrate with dimensions of the substrate prior to performing operation 2810 to determine a current etch rate uniformity. This etch rate uniformity may be compared with a previous etch rate uniformity to determine if etch rate uniformity has improved. Operation 2813 may be skipped during a first iteration of this method. The controller 220 may compare the current etch rate uniformity (or etch rate non-uniformity) to a previous etch rate uniformity (or etch rate non-uniformity) for a previous iteration of this method. If the etch rate uniformity has improved, then operation 2814 may be performed, otherwise operation 2820 may be performed.

At 2814, the controller 220 may determine whether the etch rate non-uniformity is less than a predetermined threshold. If yes, operation 2822 may be performed and values of the current levels and RF voltages may be stored in memory of the controller 220 as an updated value of the determined recipe or as a value for another recipe. If the predetermined threshold has not been met, operation 2816 may be performed.

At 2816, the controller 220 may adjust one or more of the current levels of the inner and outer coils 240 to adjust the power supplied to one or more of the coils 240 and return to operation 2804. Ion density is proportional to the power provided to the coils 240, which is related to the level of plasma density. Operations 2804, 2806, 2808, 2810, 2812 may then be performed for another substrate. In one embodiment, the operations 2804, 2806, 2808, 2810, 2812 are repeated for the same substrate.

At 2820, the controller 220 may adjust the RF voltages of the RF electrodes and then return to operation 2804. The higher the applied RF voltage, the higher the ion energy and the higher the associated etch rate. Etch rate is proportional to the square root of ion energy. Operations 2804, 2806, 2808, 2810, 2812 may then be performed for another substrate. In one embodiment, the operations 2804, 2806, 2808, 2810, 2812 are repeated for the same substrate.

Although certain parameters are described as being adjusted above for operations 2816 and 2820, other parameters may be adjusted including any of the above-described inner and outer coil parameters, RF electrode parameters, and dielectric separator parameters. The processing system may be altered based on the adjusted parameters and the above-described operations may be repeated to evaluate the updated configuration.

The above-described operations are meant to be illustrative examples. The operations may be performed sequentially, synchronously, simultaneously, continuously, during overlapping time periods or in a different order depending upon the application. Also, any of the operations may not be performed or skipped depending on the implementation and/or sequence of events.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate processing system comprising:

a substrate support arranged in a processing chamber, configured to support a substrate on an upper surface thereof, and including, a baseplate made of electrically conductive material, and M electrodes disposed in the baseplate, where M is an integer greater than or equal to two;

N radio frequency (RF) sources, where N is an integer greater than or equal to two, wherein each of the N RF sources is configured to supply a respective RF signal to one or more of the M electrodes, wherein each of the respective RF signals is supplied to a different set of the M electrodes, and wherein each of the sets includes a different one or more of the M electrodes; and a controller configured to cause one or more coils to strike and maintain plasma in the processing chamber independently of the N RF sources and to separately control voltage outputs of the N RF sources to adjust the plasma in the processing chamber.

2. The substrate processing system of claim 1, wherein M is greater than or equal to N.

3. The substrate processing system of claim 1, wherein N is greater than or equal to M.

4. The substrate processing system of claim 1, wherein the controller is configured to at least one of:

select which one or more of the N RF sources is to provide one or more of the respective RF signals to one of the M electrodes; or for each set of the M electrodes, select which one or more of the N RF sources is to provide one or more of the respective RF signals to that set of the M electrodes.

5. The substrate processing system of claim 4, wherein M is greater than or equal to N.

6. The substrate processing system of claim 1, further comprising N cavities located on an upper surface of the baseplate, wherein the M electrodes are arranged in the N cavities.

7. The substrate processing system of claim 6, wherein the M electrodes are embedded in dielectric material located in the N cavities.

8. The substrate processing system of claim 1, further comprising:

N cavities located on an upper surface of the baseplate, wherein the M electrodes are arranged in the N cavities; and one or more dielectric separators arranged between the M electrodes and the substrate.

9. The substrate processing system of claim 1, further comprising a dielectric layer arranged between the M electrodes and the baseplate.

10. The substrate processing system of claim 1, wherein a frequency of the N RF signals is the same as a frequency used to generate the plasma.

11. The substrate processing system of claim 1, wherein a frequency of the N RF signals is different than a frequency used to generate the plasma.

12. The substrate processing system of claim 1, further comprising:

the processing chamber, wherein the one or more coils include an inner coil and an outer coil, wherein the inner coil is arranged outside of the processing chamber and adjacent to a window of the processing chamber, and wherein the outer coil is arranged outside of the processing chamber adjacent to the window and radially outside of and spaced from the inner coil; and an RF source configured to power the inner coil and the outer coil, wherein the controller is further configured to control the RF source to adjust current supplied to the inner coil relative to current supplied to the outer coil.

13. The substrate processing system of claim 12, wherein the controller is configured to control the RF source to one of:

supply more current to the outer coil than to the inner coil; or supply more current to the inner coil than to the outer coil.

14. The substrate processing system of claim 1, further comprising an RF source configured to supply a bias voltage to the baseplate.

15. The substrate processing system of claim 1, wherein at least one of the N RF signals has a frequency that is different than at least another one of the N RF signals.

16. The substrate processing system of claim 1, wherein the N RF signals have the same frequency.

17. The substrate processing system of claim 1, further comprising N matching networks arranged between the N RF sources and the M electrodes.

18. The substrate processing system of claim 1, further comprising a dielectric layer disposed on the baseplate, wherein the M electrodes are disposed between the dielectric layer and the baseplate.

19. The substrate processing system of claim 18, wherein the dielectric layer comprises a plurality of dielectric separators.

20. The substrate processing system of claim 19, wherein conductive material of the baseplate is disposed between the plurality of dielectric separators.

21. A substrate processing system comprising:

a processing chamber including a window;

a substrate support arranged in the processing chamber, configured to support a substrate on an upper surface thereof and including a baseplate, and M electrodes disposed in the baseplate, where M is an integer greater than or equal to 2;

an inner coil arranged outside of the processing chamber adjacent to the window;

an outer coil arranged outside of the processing chamber adjacent to the window and radially outside of and spaced from the inner coil;

N radio frequency (RF) sources, where N is an integer greater than or equal to two, wherein each of the N RF sources is configured to supply a respective RF signal to one or more of the M electrodes, wherein each of the respective RF signals is supplied to a different set of the M electrodes, and wherein each of the sets includes a different one or more of the M electrodes;

N matching networks arranged between the N RF sources and the M electrodes; and a controller configured to strike plasma by supplying RF power to the inner and outer coils and to vary a plasma density distribution profile in the processing chamber by (i) varying power supplied to the inner coil relative to the outer coil, and (ii) varying power supplied to at least one of the M electrodes relative to at least another one of the M electrodes.

22. The substrate processing system of claim 21, wherein M is greater than or equal to N.

23. The substrate processing system of claim 21, wherein N is greater than or equal to M.

24. The substrate processing system of claim 21, wherein the controller is configured to at least one of:

select which one or more of the N RF sources is to provide one or more of the respective RF signals to one of the M electrodes; or for each set of the M electrodes, select which one or more of the N RF sources is to provide one or more of the respective RF signals to that set of the M electrodes.

25. The substrate processing system of claim 24, wherein M is greater than or equal to N.

26. The substrate processing system of claim 21, further comprising N cavities located on an upper surface of the baseplate, wherein the M electrodes are arranged in the N cavities.

27. The substrate processing system of claim 26, wherein the M electrodes are embedded in dielectric material located in the N cavities.

28. The substrate processing system of claim 21, further comprising:

N cavities located on an upper surface of the baseplate, wherein the M electrodes are arranged in the N cavities; and one or more dielectric separators arranged between the M electrodes and the substrate.

29. The substrate processing system of claim 21, further comprising a dielectric layer arranged between the M electrodes and the baseplate.

30. The substrate processing system of claim 21, wherein a frequency of the N RF signals is the same as a frequency used to generate the plasma.

31. The substrate processing system of claim 21, wherein a frequency of the N RF signals is different than a frequency used to generate the plasma.

32. The substrate processing system of claim 21, further comprising a matching network connected between an RF source and the inner coil and the outer coil.

33. The substrate processing system of claim 21, wherein the controller is configured to control the RF source to supply more current to the outer coil than to the inner coil.

34. The substrate processing system of claim 21, further comprising an RF source configured to supply a bias voltage to the baseplate.

35. The substrate processing system of claim 21, wherein at least one of the N RF signals has a frequency that is different than at least another one of the N RF signals.

36. The substrate processing system of claim 21, wherein the N RF signals have the same frequency.

37. The substrate processing system of claim 21, wherein:

the M electrodes comprise a first electrode and a second electrode; and the controller is configured to control the supply of the RF signals such that a first amount of power is supplied to the inner coil and a second amount of power is supplied to the outer coil, wherein the first amount of power is different than the second amount of power, and a first RF voltage is supplied to the first electrode and a second RF voltage is supplied to the second electrode, wherein the first RF voltage is greater than the second RF voltage.

38. The substrate processing system of claim 37, wherein the first electrode is disposed in the baseplate more radially inward than the second electrode and receives a higher RF voltage than the second electrode.

39. The substrate processing system of claim 37, wherein the first electrode is disposed more radially outward in the baseplate than the second electrode and receives a higher RF voltage than the second electrode.

40. The substrate processing system of claim 21, wherein:

the M electrodes comprise a first set of electrodes and a second set of electrodes;

the first set of electrodes correspond to a first RF zone;

the second set of electrodes correspond to a second RF zone; and the second RF zone is located radially inwardly from the first RF zone.

41. The substrate processing system of claim 21, wherein the M electrodes are disposed in a plane parallel to and offset from the upper surface of the substrate support.

42. The substrate processing system of claim 21, wherein the M electrodes are disposed in different layers of the baseplate.

43. The substrate processing system of claim 21, wherein the controller is configured to control the N RF signals to adjust the plasma to increase plasma uniformity during a transient period during startup of the N RF sources.

44. The substrate processing system of claim 21, wherein one or more of the M electrodes also operates as a heating element.

45. A substrate processing system comprising:

a processing chamber including a window;

a substrate support arranged in the processing chamber, configured to support a substrate on an upper surface thereof and including a baseplate, and a dielectric layer arranged above the baseplate and including M electrodes disposed in the dielectric layer, where M is an integer greater than or equal to two;

an inner coil arranged outside of the processing chamber adjacent to the window;

an outer coil arranged outside of the processing chamber adjacent to the window and radially outside of and spaced from the inner coil;

N radio frequency (RF) sources, where N is an integer greater than or equal to two, wherein each of the N RF sources is configured to supply a respective RF signal to one or more of the M electrodes, wherein each of the respective RF signals is supplied to a different set of the M electrodes, and wherein each of the sets includes a different one or more of the M electrodes;

N matching networks arranged between the N RF sources and the M electrodes; and a controller configured to strike plasma by supplying RF power to the inner and outer coils and to vary a plasma density distribution profile in the processing chamber by (i) varying power supplied to the inner coil relative to the outer coil, and (ii) varying power supplied to at least one of the M electrodes relative to power supplied to at least another one the M electrodes.

46. The substrate processing system of claim 45, wherein M is greater than or equal to N.

47. The substrate processing system of claim 45, wherein N is greater than or equal to M.

48. The substrate processing system of claim 45, wherein the controller is configured to at least one of:

select which one or more of the N RF sources is to provide one or more of the respective RF signals to one of the M electrodes; or for each set of the M electrodes, select which one or more of the N RF sources is to provide one or more of the respective RF signals to that set of the M electrodes.

49. The substrate processing system of claim 48, wherein M is greater than or equal to N.

50. The substrate processing system of claim 45, wherein a frequency of the N RF signals is the same as a frequency used to generate the plasma.

51. The substrate processing system of claim 45, wherein a frequency of the N RF signals is different than a frequency used to generate the plasma.

52. The substrate processing system of claim 45, further comprising a matching network connected between an RF source and the inner coil and the outer coil.

53. The substrate processing system of claim 45, wherein the controller is configured to control the RF source to supply more current to the outer coil than to the inner coil.

54. The substrate processing system of claim 45, further comprising an RF source configured to supply a bias voltage to the baseplate.

55. The substrate processing system of claim 45, wherein at least one of the N RF signals has a frequency that is different than at least another one of the N RF signals.

56. The substrate processing system of claim 45, wherein the N RF signals have the same frequency.

57. The substrate processing system of claim 45, wherein:

the M electrodes comprise a first electrode and a second electrode; and the controller is configured to control the supply of the RF signals such that a first amount of power is supplied to the inner coil and a second amount of power is supplied to the outer coil, wherein the first amount of power is different than the second amount of power, and a first RF voltage is supplied to the first electrode and a second RF voltage is supplied to the second electrode, wherein the first RF voltage is greater than the second RF voltage.

58. The substrate processing system of claim 57, wherein the first electrode is disposed in the baseplate more radially inward than the second electrode and receives a higher RF voltage than the second electrode.

59. The substrate processing system of claim 57, wherein the first electrode is disposed more radially outward in the baseplate than the second electrode and receives a higher RF voltage than the second electrode.

60. The substrate processing system of claim 45, wherein:

the M electrodes comprise a first set of electrodes and a second set of electrodes;

the first set of electrodes correspond to a first RF zone;

the second set of electrodes correspond to a second RF zone; and the second RF zone is located radially inwardly from the first RF zone.

61. The substrate processing system of claim 45, wherein the M electrodes are disposed in the dielectric layer and in a plane parallel to and below the upper surface of the substrate support.

62. The substrate processing system of claim 45, wherein the M electrodes are disposed in different layers of the baseplate.

63. The substrate processing system of claim 45, wherein the controller is configured to control the N RF signals to adjust the plasma to increase plasma uniformity during a transient period during startup of the N RF sources.

64. The substrate processing system of claim 45, wherein one or more of the M electrodes also operates as a heating element.

65. The substrate processing system of claim 45, further comprising another dielectric layer disposed on the baseplate, wherein the M electrodes are disposed between the another dielectric layer and the baseplate.

66. The substrate processing system of claim 65, wherein the dielectric layer comprises a plurality of dielectric separators.

67. The substrate processing system of claim 66, wherein conductive material of the baseplate is disposed between the plurality of dielectric separators.

* * * * *